(12) United States Patent
Kuroda et al.

(10) Patent No.: US 8,508,911 B2
(45) Date of Patent: Aug. 13, 2013

(54) ELECTRONIC COMPONENT AND SUBSTRATE MODULE

(75) Inventors: Yoichi Kuroda, Nagaokakyo (JP); Yoshio Kawaguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 44 days.

(21) Appl. No.: 13/359,524

(22) Filed: Jan. 27, 2012

(65) Prior Publication Data

US 2012/0194965 A1    Aug. 2, 2012

(30) Foreign Application Priority Data

Jan. 28, 2011    (JP) .................................. 2011-016825

(51) Int. Cl.
*H01G 4/005* (2006.01)

(52) U.S. Cl.
USPC ...................... 361/303; 361/321.1; 361/321.2; 361/306.1; 361/306.3; 361/305

(58) Field of Classification Search
USPC .............. 361/303–305, 308.1, 309, 311–313, 361/321.1, 321.2, 321.4, 301.2
See application file for complete search history.

(56) References Cited

U.S. PATENT DOCUMENTS

| | | | |
|---|---|---|---|
| 6,191,932 B1 | 2/2001 | Kuroda et al. | |
| 6,970,341 B1* | 11/2005 | Devoe et al. | 361/303 |
| 7,035,079 B1* | 4/2006 | Park et al. | 361/303 |
| 7,292,430 B2* | 11/2007 | Lee et al. | 361/306.3 |
| 7,394,643 B2* | 7/2008 | Yamane et al. | 361/303 |
| 7,433,172 B2* | 10/2008 | Togashi | 361/306.1 |
| 7,715,172 B2* | 5/2010 | Kawasaki et al. | 361/303 |
| 8,004,819 B2* | 8/2011 | Nagamiya et al. | 361/303 |

FOREIGN PATENT DOCUMENTS

| | | |
|---|---|---|
| EP | 0 915 488 A2 | 5/1999 |
| JP | 07-201635 A | 8/1995 |
| JP | 11-144996 A | 5/1999 |
| JP | 11-329894 A | 11/1999 |
| JP | 2001-185440 A | 7/2001 |
| JP | 2001-185441 A | 7/2001 |
| JP | 2004-140183 A | 5/2004 |

OTHER PUBLICATIONS

Kuroda et al., "Electronic Component and Substrate Module", U.S. Appl. No. 13/359,520, filed Jan. 27, 2012.

* cited by examiner

*Primary Examiner* — Nguyen T Ha
(74) *Attorney, Agent, or Firm* — Keating & Bennett, LLP

(57) ABSTRACT

A multilayer body includes first and second capacitance conductors and an internal conductor, which define a capacitor, provided therein. First and second external electrodes are respectively connected to the first and second capacitance conductors via first and second led out conductors. The internal conductor faces the first and second capacitance conductors. Third and fourth external electrodes are connected to the first capacitance conductor via third and fourth led out conductors. Fifth and sixth external electrodes are connected to the second capacitance conductor via fifth and sixth led out conductors.

8 Claims, 22 Drawing Sheets

ELECTRONIC COMPONENT AND SUBSTRATE MODULE

BACKGROUND OF THE INVENTION

1. Field of the Invention

The present invention relates to electronic components and substrate modules and more specifically relates to electronic components and substrate modules including a built-in capacitor.

2. Description of the Related Art

A multilayer capacitor described in Japanese Unexamined Patent Application Publication No. 2004-140183 is a known example of an electronic component of the related art. FIG. 22 is a front view of a multilayer capacitor 500 described in Japanese Unexamined Patent Application Publication No. 2004-140183.

The multilayer capacitor 500 includes a multilayer body 502, internal conductors 504 and 506, led out electrodes 508 and 510 and external electrodes 512 and 514. The multilayer body 502 is formed by stacking a plurality of dielectric layers on top of one another. In FIG. 22, the surface of the multilayer body 502 on the lower side is a mounting surface. The internal conductors 504 and 506 are stacked together with the dielectric layers and face each other with a dielectric layer interposed therebetween, whereby an electrostatic capacitance is formed. The led out electrodes 508 and 510 are respectively connected to the internal conductors 504 and 506 and are led out to the mounting surface. The external electrodes 512 and 514 are respectively connected to the led out electrodes 508 and 510. In the above-described multilayer capacitor 500, by making the distance between the led out electrodes 508 and 510 and the distance from the internal conductors 504 and 506 to the mounting surface maintain a predetermined relationship with each other, a decrease in the equivalent serial inductance is achieved.

However, in the multilayer capacitor 500 described in Japanese Unexamined Patent Application Publication No. 2004-140183, since the external electrodes 512 and 514 are close to each other, there is a risk that the external electrode 512 and the external electrode 514 will become connected to each other with solder when the multilayer capacitor 500 is mounted on a circuit substrate. That is, with the multilayer capacitor 500, there is a risk of a short circuit occurring.

SUMMARY OF THE INVENTION

Accordingly, preferred embodiments of the present invention provide an electronic component and a substrate module with which a reduction in ESL can be achieved and with which the occurrence of short circuits when mounting the electronic component on a circuit substrate can be prevented and suppressed.

An electronic component according to a preferred embodiment of the present invention includes a substantially rectangular-parallelepiped-shaped multilayer body including a plurality of dielectric layers stacked on top of one another; a first capacitance conductor that is provided on one of the dielectric layers; a first led out conductor that is connected to the first capacitance conductor and is led out to a first end surface of the multilayer body; a third led out conductor that is connected to the first capacitance conductor and is led out to a first side surface of the multilayer body; a second capacitance conductor that is provided on one of the dielectric layers; a second led out conductor that is connected to the second capacitance conductor and is led out to a second end surface of the multilayer body; a fourth led out conductor that is connected to the second capacitance conductor and is led out to the first side surface; a third capacitance conductor that is provided on one of the dielectric layers and that opposes the first capacitance conductor and the second capacitance conductor via the dielectric layer therebetween; a first external electrode and a second external electrode that are arranged so as to extend over the first end surface and the second end surface respectively and onto a bottom surface of the multilayer body and that are respectively connected to the first led out conductor and the second led out conductor; a third external electrode that is provided on the first side surface and is connected to the third led out conductor; and a fourth external electrode that is provided on the first side surface and is connected to the fourth led out conductor.

A substrate module according to a preferred embodiment of the present invention includes a circuit substrate that includes a first land and a second land; and the electronic component according to the above-described preferred embodiment of the present invention, which is mounted on the circuit substrate; wherein the first external electrode is connected to the first land and the second external electrode is connected to the second land.

According to various preferred embodiments of the present invention, a reduction in ESL can be achieved and the occurrence of short circuits when mounting the electronic component on the circuit substrate can be prevented and suppressed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
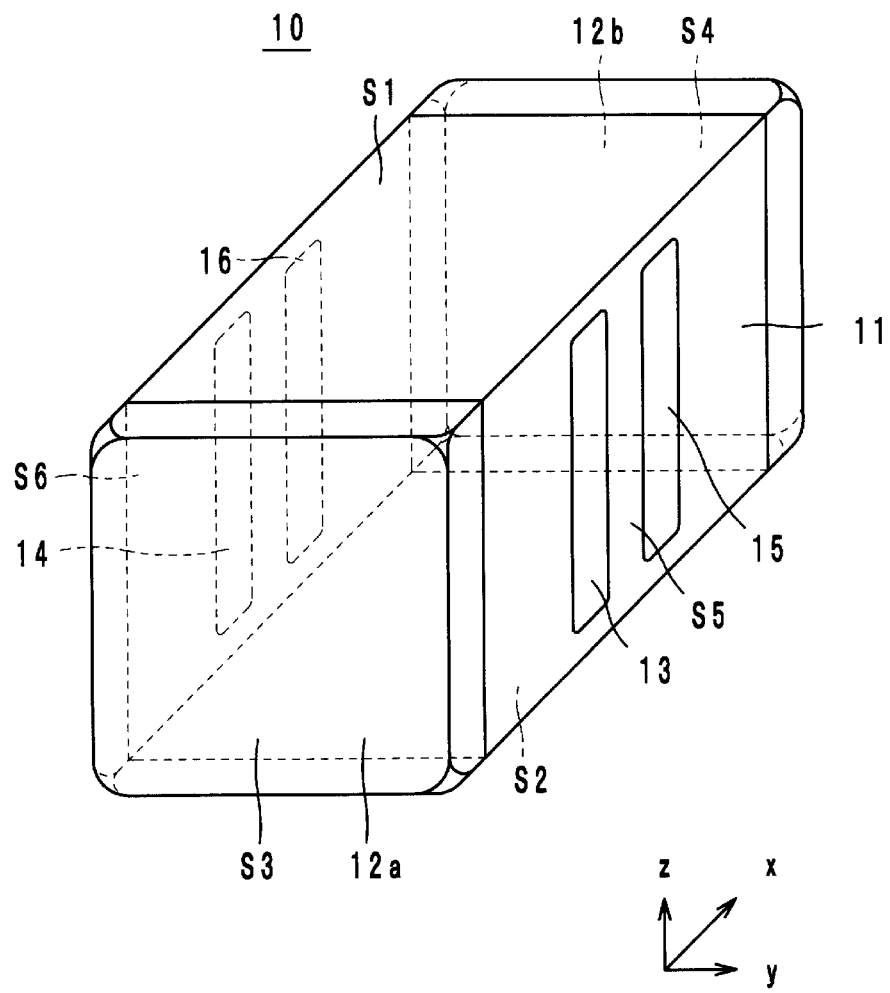
FIG. 1 is an exterior perspective view of an electronic component according to a first preferred embodiment of the present invention.
Figure 2:
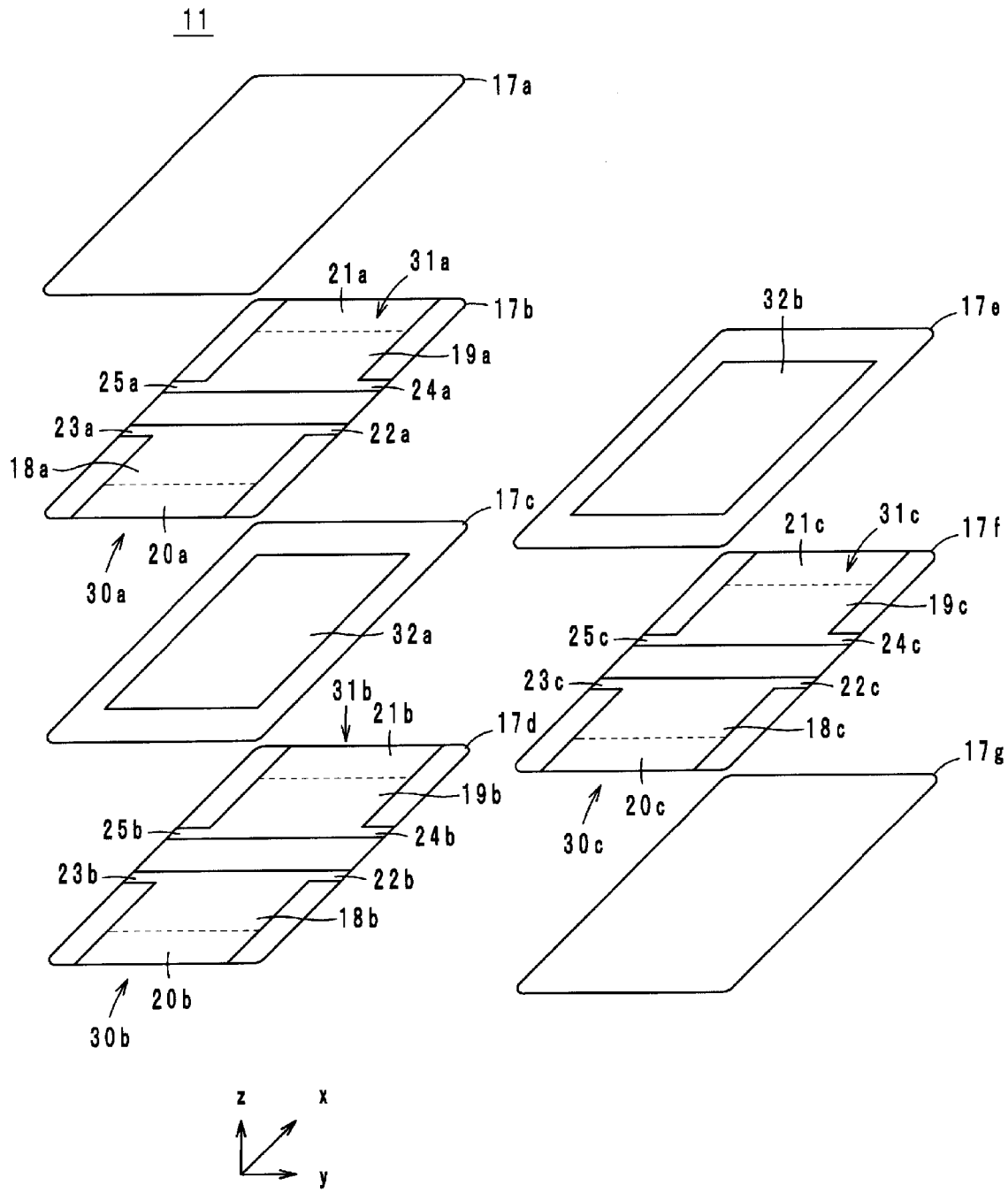
FIG. 2 is an exploded perspective view of a multilayer body of the electronic component of FIG. 1.
Figure 3A:
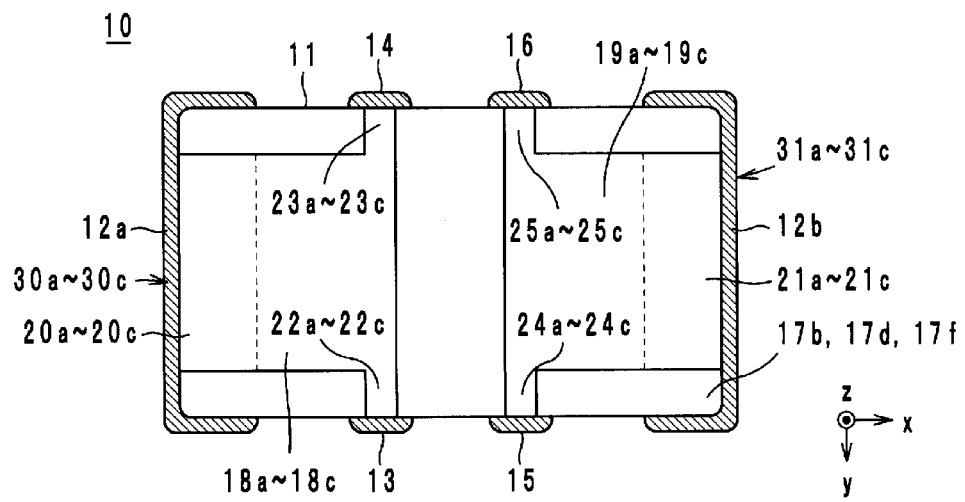
FIGS. 3A and 3B are plan views of the inside of the electronic component of FIG. 1.
Figure 3B:
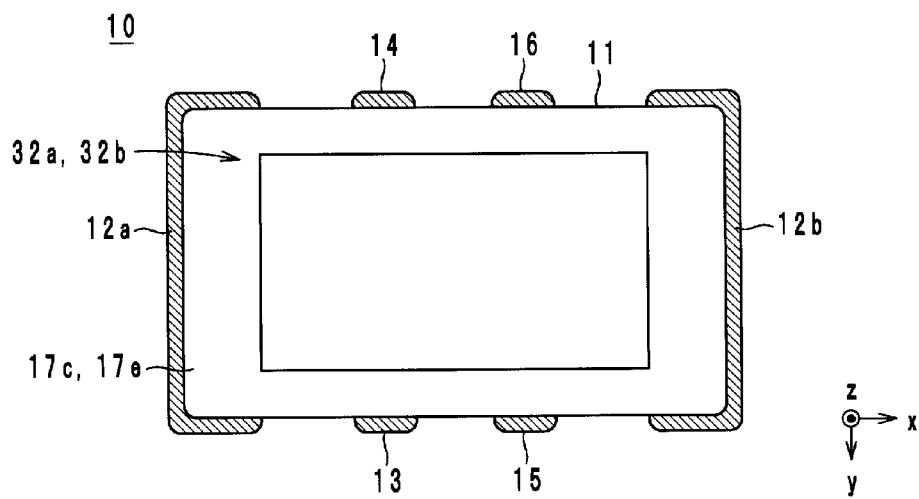

Hereafter, electronic components and substrate modules according to preferred embodiments of the present invention will be described with reference to the drawings.
First Preferred Embodiment First, the configuration of an electronic component according to a first preferred embodiment will be described with reference to the drawings. FIG. 1 is an external perspective view of an electronic component 10 according to the first preferred embodiment. FIG. 2 is an exploded perspective view of a multilayer body 11 of the electronic component 10 of FIG. 1. FIGS. 3A and 3B are plan views of the inside of the electronic component 10 of FIG. 1. Hereafter, a stacking direction of the multilayer body 11 will be defined as a z-axis direction. A direction in which the long sides of the multilayer body 11 extend when the multilayer body 11 is viewed in plan from the z-axis direction will be defined as an x-axis direction. A direction in which the short sides of the multilayer body 11 extend when the multilayer body 11 is viewed in plan from the z-axis direction will be defined as a y-axis direction.

The electronic component 10 is, for example, a chip capacitor and, as illustrated in FIGS. 1, 2 and 3A and 3B, includes the multilayer body 11, external electrodes 12 (12a and 12b) and 13 to 16, and internal conductors 30 (30a to 30c), 31 (31a to 31c) and 32 (32a and 32b) (not illustrated in FIG. 1).

The multilayer body 11 preferably has a substantially rectangular parallelepiped shape. In the present preferred embodiment, the multilayer body 11 preferably has a shape in which corners and edges thereof are rounded by being subjected to chamfering. Hereafter, in the multilayer body 11, a surface on the positive side in the z-axis direction will be referred to as an upper surface S1 and a surface on the negative side in the z-axis direction will be referred to as a lower surface S2. In addition, a surface on the negative side in the x-axis direction will be referred to as an end surface S3 and a surface on the positive side in the x-axis direction will be referred to as an end surface S4. Furthermore, a surface on the positive side in the y-axis direction will be referred to as a side surface S5 and a surface on the negative side in the y-axis direction will be referred to as a side surface S6.

The multilayer body 11, as illustrated in FIG. 2, is formed preferably by stacking a plurality of ceramic layers 17 (17a to 17g) on top of one another in this order from the positive side to the negative side in the z-axis direction. The ceramic layers 17 preferably have substantially rectangular shapes and are fabricated using a dielectric ceramic. Hereafter, main surfaces of the ceramic layers 17 on the positive side in the z-axis direction will be referred to as top surfaces and the main surfaces of the ceramic layers 17 on the negative side in the z-axis direction will be referred to as bottom surfaces.

The upper surface S1 of the multilayer body 11 is defined by the top surface of the ceramic layer 17a provided furthest toward the positive side in the z-axis direction. The lower surface S2 of the multilayer body 11 is defined by the bottom surface of the ceramic layer 17g provided furthest toward negative side in the z-axis direction. In addition, the short edges of the ceramic layers 17a to 17g on the negative side in the x-axis direction line up with one another and thereby define the end surface S3. The short edges of the ceramic layers 17a to 17g on the positive side in the x-axis direction line up with one another and thereby define the end surface S4. The long edges of the ceramic layers 17a to 17g on the positive side in the y-axis direction line up with one another and thereby define the side surface S5. The long edges of the ceramic layers 17a to 17g on the negative side in the y-axis direction line up with one another and thereby define the side surface S6.

As illustrated in FIG. 2 and FIGS. 3A and 3B, the internal conductors 30a to 30c and 31a to 31c are respectively provided on the top surfaces of the ceramic layers 17b, 17d and 17f and are built into the multilayer body 11. In addition, as illustrated in FIG. 2 and FIGS. 3A and 3B, the internal conductors 32a and 32b are respectively provided on the top surfaces of the ceramic layers 17c and 17e and are built into the multilayer body 11. In other words, the internal conductors 30 and 31 and the internal conductor 32 are alternately stacked in the z-axis direction.

The internal conductor 30 (30a to 30c) includes a capacitance conductor 18 (18a to 18c) and led out conductors 20 (20a to 20c), 22 (22a to 22c) and 23 (23a to 23c). The capacitance conductor 18 has a substantially rectangular shape and is provided on the top surface of the ceramic layer 17 so as not to be in contact with the external periphery of the ceramic layer 17. The capacitance conductor 18 is provided within a region that covers about half the ceramic layer 17 on the negative side in the x-axis direction.

The led out conductor 20 is connected to the capacitance conductor 18 and is exposed at the end surface S3 as a result of being led out to the end surface S3 of the multilayer body 11. In more detail, the led out conductor 20 is led out from the long edge of the capacitance conductor 18 on the negative side in the x-axis direction toward the negative side in the x-axis direction. Thus, the led out conductor 20 is led out to the short edge of the ceramic layer 17 on the negative side in the x-axis direction. The width of the led out conductor 20 in the y-axis direction matches the width of the capacitance conductor 18 in the y-axis direction.

The led out conductor 22 is connected to the capacitance conductor 18 and is exposed at the side surface S5 as a result of being led out to the side surface S5 of the multilayer body 11. In more detail, the led out conductor 22 extends from an end portion of the capacitance conductor 18, which is at a short edge the capacitance conductor 18 on the positive side in the y-axis direction and on the positive side in the x-axis direction, toward the positive side in the y-axis direction. Thus, the led out conductor 22 is led out to a position on the negative side in the x-axis direction of a center point of the long edge of the ceramic layer 17 on the positive side in the y-axis direction. Furthermore, the led out conductor 22 is not in contact with the led out conductor 20.

The led out conductor 23 is connected to the capacitance conductor 18 and is exposed at the side surface S6 as a result of being led out to the side surface S6 of the multilayer body 11. In more detail, the led out conductor 23 extends from an end portion of the capacitance conductor 18, which is at a short edge the capacitance conductor 18 on the negative side in the y-axis direction and on the positive side in the x-axis direction, toward the negative side in the y-axis direction. Thus, the led out conductor 23 is led out to a position on the negative side in the x-axis direction of a center point of the long edge of the ceramic layer 17 on the negative side in the y-axis direction. Furthermore, the led out conductor 23 is not in contact with the led out conductor 20.

The internal conductor 31 (31a to 31c) has a capacitance conductor 19 (19a to 19c) and led out conductors 21 (21a to 21c), 24 (24a to 24c), and 25 (25a to 25c). The capacitance conductor 19 has a substantially rectangular shape and is arranged on the top surface of the ceramic layer 17 so as not to be in contact with the external periphery of the ceramic layer 17. The capacitance conductor 19 is provided within a region that covers about half the ceramic layer 17 on the positive side in the x-axis direction. The capacitance conductors 18 and 19 are provided on the top surface of the same ceramic layer 17 and face each other.

The led out conductor 21 is connected to the capacitance conductor 19 and is exposed at the end surface S4 as a result of being led out to the end surface S4 of the multilayer body 11. In more detail, the led out conductor 21 is led out from the long edge of the capacitance conductor 19 on the positive side in the x-axis direction toward the positive side in the x-axis direction. Thus, the led out conductor 21 is led out to the short edge of the ceramic layer 17 on the positive side in the x-axis direction. The width of the led out conductor 21 in the y-axis direction matches the width of the capacitance conductor 19 in the y-axis direction.

The led out conductor 24 is connected to the capacitance conductor 19 and is exposed at the side surface S5 as a result of being led out to the side surface S5 of the multilayer body 11. In more detail, the led out conductor 24 extends from an end portion of the capacitance conductor 19, which is at a short edge the capacitance conductor 19 on the positive side in the y-axis direction and on the negative side in the x-axis direction, toward the positive side in the y-axis direction. Thus, the led out conductor 24 is led out to a position on the positive side in the x-axis direction of a center point of the long edge of the ceramic layer 17 on the positive side in the y-axis direction. In other words, the led out conductor 24 is located on the positive side in the x-axis direction from the led out conductor 22 when viewed in plan from the z-axis direction. Furthermore, the led out conductor 24 is not in contact with the led out conductor 21.

The led out conductor 25 is connected to the capacitance conductor 19 and is exposed at the side surface S6 as a result of being led out to the side surface S6 of the multilayer body 11. In more detail, the led out conductor 25 extends from an end portion of the capacitance conductor 19, which is at a short edge the capacitance conductor 19 on the negative side in the y-axis direction and on the negative side in the x-axis direction, toward the negative side in the y-axis direction. Thus, the led out conductor 25 is led out to a position on the positive side in the x-axis direction of a center point of the long edge of the ceramic layer 17 on the negative side in the y-axis direction. In other words, the led out conductor 25 is located on the positive side in the x-axis direction from the led out conductor 23 when viewed in plan from the z-axis direction. Furthermore, the led out conductor 25 is not in contact with the led out conductor 21.

The internal conductor 32 (32a and 32b) is a capacitance conductor that has a substantially rectangular shape and is provided on the top surface of the ceramic layer 17 so as not to be in contact with the external periphery of the ceramic layer 17. The internal conductor 32 is provided on the top surface of a different ceramic layer 17 from the ceramic layer 17 on which the capacitance conductors 18 and 19 are provided and the internal conductor 32 faces the capacitance conductors 18 and 19 with a corresponding one of the ceramic layers 17 therebetween. As a result, capacitances are generated between the capacitance conductors 18 and 19 and the internal conductor 32. The capacitance generated between the capacitance conductor 18 and the internal conductor 32 and the capacitance generated between the capacitance conductor 19 and the internal conductor 32 are connected in series with each other.

The external electrodes 12a and 12b are respectively arranged so as to extend over the end surfaces S3 and S4 and onto the upper surface S1, the lower surface S2 and the side surfaces S5 and S6 of the multilayer body 11, and are respectively connected to the led out conductors 20a to 20c and the led out conductors 21a to 21c. In more detail, the external electrode 12a covers the entirety of the end surface S3 of the multilayer body 11 so as to cover portions where the led out conductors 20a to 20c are exposed at the end surface S3. In addition, the external electrode 12a is folded over onto the upper surface S1 and the lower surface S2 and the side surfaces S5 and S6 from the end surface S3. The external electrode 12b covers the entirety of the end surface S4 of the multilayer body 11 so as to cover portions where the led out conductors 21a to 21c are exposed at the end surface S4. In addition, the external electrode 12b is folded over onto the upper surface S1 and the lower surface S2 and the side surfaces S5 and S6 from the end surface S4.

The external electrodes 13 and 14 are respectively provided on the side surfaces S5 and S6 and are respectively connected to the led out conductors 22a to 22c and the led out conductors 23a to 23c. In more detail, the external electrode 13 preferably have a substantially strip-shaped configuration that extends in the z-axis direction on the side surface S5 of the multilayer body 11 so as to cover portions where the led out conductors 22a to 22c are exposed at the side surface S5. The external electrode 14 preferably has a substantially strip-shaped configuration that extends in the z-axis direction on the side surface S6 of the multilayer body 11 so as to cover portions where the led out conductors 23a to 23c are exposed at the side surface S6. Here, the external electrode 14 opposes the external electrode 13.

The external electrodes 15 and 16 are respectively provided on the side surfaces S5 and S6 and are respectively connected to the led out conductors 24a to 24c and the led out conductors 25a to 25c. In more detail, the external electrode 15 preferably has a substantially strip-shaped configuration that extends in the z-axis direction on the side surface S5 of the multilayer body 11 so as to cover portions where the led out conductors 24a to 24c are exposed at the side surface S5. In addition, since the led out conductor 24 is positioned on the positive side in the x-axis direction from the led out conductor 22, the external electrode 15 is positioned on the positive side in the x-axis direction from the external electrode 13. The external electrode 16 preferably has a substantially strip-shaped configuration that extends in the z-axis direction on the side surface S6 of the multilayer body 11 so as to cover portions where the led out conductors 25a to 25c are exposed at the side surface S6. Here, the external electrode 16 opposes the external electrode 15. In addition, since the led out conductor 25 is positioned on the positive side in the x-axis direction from the led out conductor 23, the external electrode 16 is positioned on the positive side in the x-axis direction from the external electrode 14.

In addition, in the electronic component 10, as illustrated in FIG. 1, on the side surfaces S5 and S6, external electrodes that are held at potentials different from those of the external electrodes 13 and 14 are not provided between the end surface S3 and external electrodes 13 and 14. As illustrated in FIG. 1, the external electrode 12a is folded over onto the side surfaces S5 and S6 from the end surface S3. Consequently, the external electrode 12a is arranged so as to be between the end surface S3 and the external electrodes 13 and 14. Here, the external electrode 12a is electrically connected to the external electrodes 13 and 14 via the internal conductor 30. Consequently, the potential of the external electrode 12a is equal to that of the external electrodes 13 and 14.

In addition, in the electronic component 10, as illustrated in FIG. 1, on the side surfaces S5 and S6, external electrodes held at potentials different from those of the external electrodes 15 and 16 are not provided between the end surface S4 and the external electrodes 15 and 16. As illustrated in FIG. 1, the external electrode 12b is folded over onto the side surfaces S5 and S6 from the end surface S4. Consequently, the external electrode 12b is arranged so as to be between the end surface S4 and the external electrodes 15 and 16. Here, the external electrode 12b is electrically connected to the external electrodes 15 and 16 via the internal conductor 31. Consequently, the potential of the external electrode 12b is equal to that of the external electrodes 15 and 16.

In addition, on the side surface S5, external electrodes held at potentials different from those of the external electrodes 13 and 15 are not provided between the external electrode 13 and the external electrode 15. In addition, on the side surface S6, external electrodes held at potentials different from those of the external electrodes 14 and 16 are not provided between the external electrode 14 and the external electrode 16. In other words, external electrodes are not provided between the external electrodes 13 and 15 and between the external electrodes 14 and 16. Thus, the external electrodes 13 and 15 are adjacent to each other and the external electrodes 14 and 16 are adjacent to each other.

Next, a non-limiting example of a method of manufacturing the electronic component 10 will be described. FIG. 1 and FIGS. 3A and 3B will be referred to hereafter.

First, $BaTiO_3$, $CaTiO_3$, $SrTiO_3$ or $CaZrO_3$, as a main component, and a Mn compound, an Fe compound, a Cr compound, a Co compound, a Ni compound or a rare earth element compound, as a sub-component, are weighed in specific proportions, put into a ball mill and subjected to wet mixing. The obtained mixture is dried and then pulverized, and the obtained powder is calcined. The obtained calcined powder is subjected to wet pulverization in a ball mill, is dried and is then cracked, whereby a dielectric ceramic powder is obtained.

An organic binder and an organic solvent are added to the dielectric ceramic powder and mixing is performed in a ball mill. Ceramic green sheets that will become the ceramic layers are fabricated by forming the obtained ceramic slurry into sheets on carrier sheets using a doctor blade method and then drying the sheets. It is preferable that the thickness of each of the ceramic layers 17 after firing be about 0.5 µm or more and about 10 µm or less, for example.

Next, the internal conductors 30 to 32 are formed on the ceramic green sheets that will become the ceramic layers 17 by applying a paste composed of a conductive material by using a method such as a screen printing method or a photolithographic method. The paste composed of a conductive material, for example, is formed by adding an organic binder and an organic solvent to a metal powder. The metal powder is for example Ni, Cu, Ag, Pd, an Ag—Pd alloy, or Au. It is preferable that the thickness of the internal conductors 30 to 32 after firing be about 0.3 µm or more and about 2.0 µm or less, for example.

Next, the ceramic green sheets that will become the ceramic layers 17 are stacked on top of one another and a yet-to-be-fired mother multilayer body is obtained. Then, the yet-to-be-fired mother multilayer body is subjected to press bonding by using a hydrostatic press.

Next, the yet-to-be-fired mother multilayer body is cut into pieces of predetermined dimensions, whereby a plurality of yet-to-be-fired multilayer bodies 11 are obtained. After that, surfaces of the each of the multilayer bodies 11 are subjected to a polishing process such as a barrel polishing process.

Next, the yet-to-be fired multilayer body 11 is fired. The firing temperature is preferably about 900° C. or more and about 1300° C. or less, for example. Through the above-described processes, preparation of the multilayer body 11 is completed.

Next, the external electrodes 12 to 16 are formed on the multilayer body 11. Specifically, a conductive paste is applied to the surfaces of the multilayer body 11 by using, for example, a publicly known dip method or slit method. Base electrodes of the external electrodes 12 to 16 are formed by baking the conductive paste at a temperature of about 700° C. or more and about 900° C. or less, for example. Examples of a material of the conductive paste include Cu, Ni, Ag, Pd, a Ag—Pd alloy and Au. The thickness of the base electrodes is preferably about 10 µm or more and about 50 µm or less, for example. Next, plating is performed on the base electrodes, and thus the external electrodes 12 to 16 are completed. Examples of a material of the plating layers include Cu, Ni, Ag, Pd, an Ag—Pd alloy and Au. In addition, a plurality of plating layers may be formed on the base electrodes by performing plating a plurality of times. Through the above-described processes, the electronic component 10 is completed.

Figure 4A:
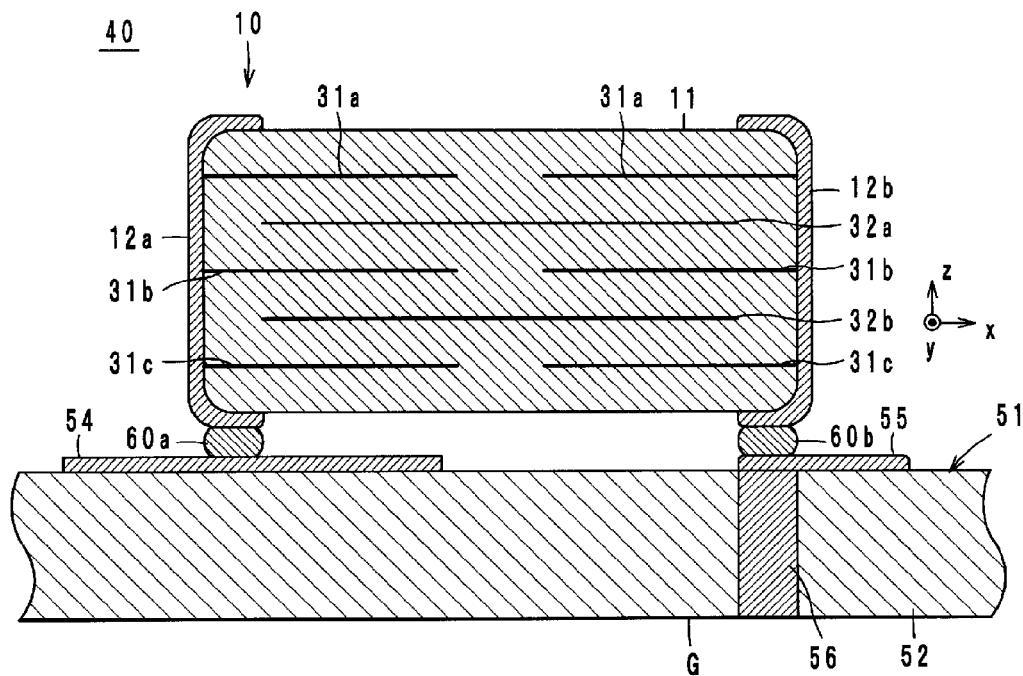
FIG. 4A is a sectional structural view of a substrate module and FIG. 4B is a view in which the substrate module is viewed in plan from a positive side in the z-axis direction.
Figure 4B:
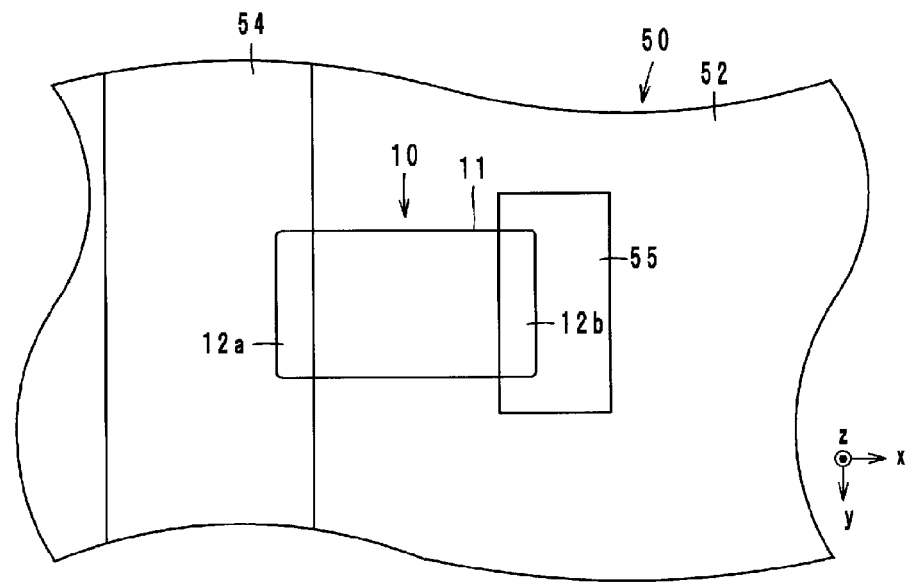
Figure 5:
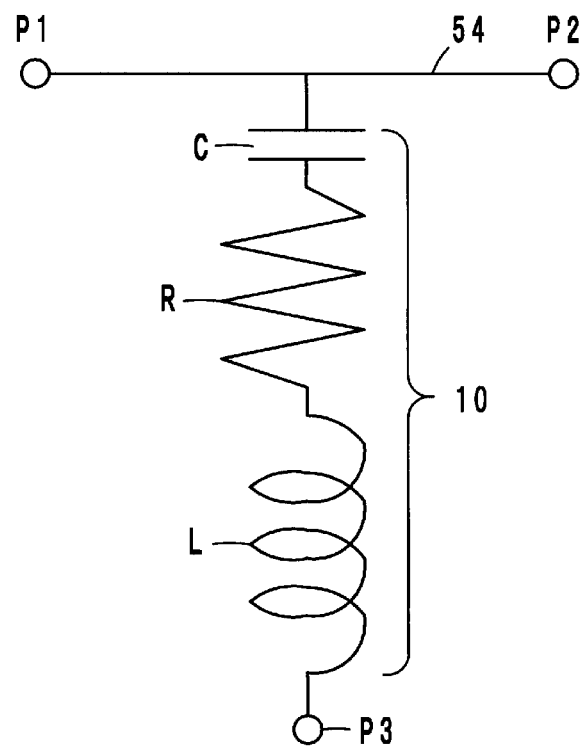
FIG. 5 is an equivalent circuit diagram of the substrate module of FIGS. 4A and 4B.

Next, a substrate module 40 equipped with the electronic component 10 will be described while referring to the drawings. FIG. 4A is a sectional structural view of the substrate module 40 and FIG. 4B is a view in which the substrate module 40 is viewed in plan from a positive side in the z-axis direction. FIG. 5 is an equivalent circuit diagram of the substrate module 40 of FIGS. 4A and 4B.

The substrate module 40, as illustrated in FIG. 4A, includes the electronic component 10 and a circuit substrate 51. The circuit substrate 51 includes a substrate body 52, a signal conductor 54, a ground electrode 55, a via hole conductor 56 and a ground conductor G.

The substrate body 52 is a multilayer substrate formed by stacking a plurality of ceramic layers and conductive layers on top of one another, and the substrate body includes an electric circuit on a main surface thereof and inside thereof. The signal conductor 54 is provided on the main surface of the substrate body 52 on the positive side in the z-axis direction, and, as illustrated in FIG. 4B, extends in the y-axis direction. An input port P1, which is not illustrated, is provided at an end portion of the signal conductor 54 on the positive side in the y-axis direction, and an output port P2, which is not illustrated, is provided at an end portion of the signal conductor 54 on the negative side in the y-axis direction. The ground electrode 55 is provided on the main surface of the circuit substrate 51 on the positive side in the z-axis direction, and as illustrated in FIG. 4B is formed in a substantially rectangular shape.

The ground conductor G is provided inside the substrate body 52 and is held at a ground potential. The ground conductor G is connected to a ground port P3, which is not illustrated. The via hole conductor 56 is provided inside the substrate body 52 and connects the ground electrode 55 and the ground conductor G. Thus, the ground electrode 55 is also held at the ground potential.

The electronic component 10 is mounted on the circuit substrate 51. In more detail, the external electrode 12a is connected to the signal conductor 54 with solder 60a. In addition, the external electrode 12b is connected to the ground electrode 55 with solder 60b. Thus, the substrate module 40 comes to have the circuit configuration illustrated in FIG. 5. That is, the signal conductor 54 connects the input port P1 and the output port P2. The electronic component 10 is provided between the signal conductor 54 and the ground port P3. In FIG. 5, a capacitor C, a resistor R and a coil L represent an electrostatic capacitance, an electrical resistance and an inductance possessed by the electronic component 10. The substrate module 40 has the configuration illustrated in FIG. 5 and as a result a high-frequency signal is input from the input port P1 and output from the output port P2. In addition, a high-frequency signal having the resonant frequency of the electronic component 10, among high-frequency signals input from the input port P1 is not output from the output port P2, but rather is output from the ground port P3. The circuit configuration of the substrate module 40 is not limited to that illustrated in FIG. 5. Therefore, in the substrate module 40, the electronic component 10 may instead be provided between the input port P1 and the output port P2.

Figure 6:
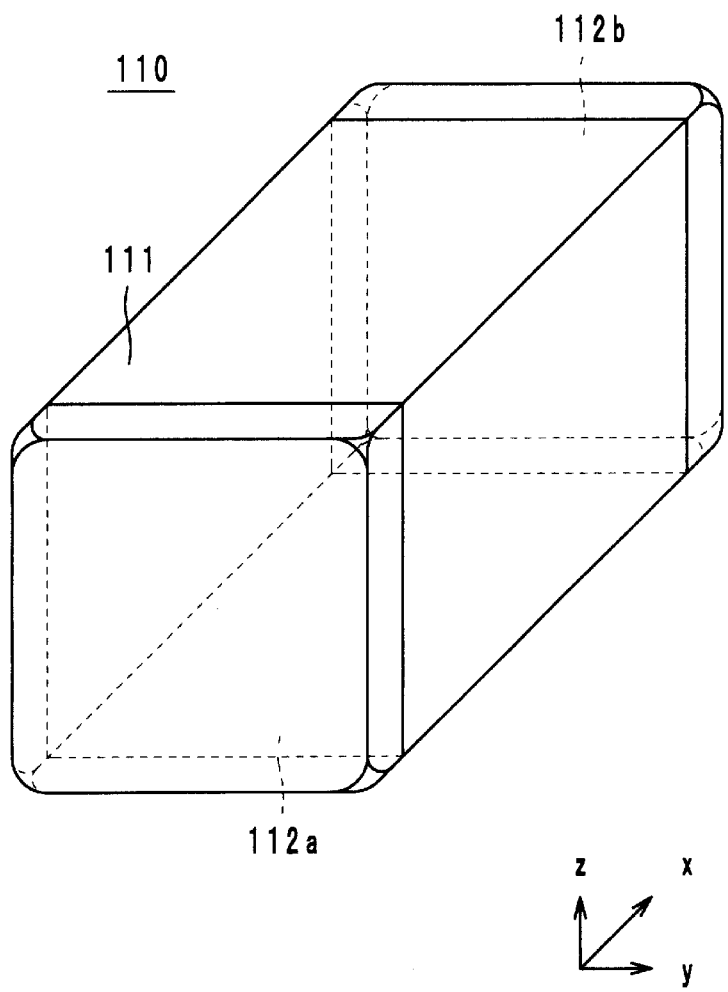
FIG. 6 is an exterior perspective view of an electronic component according to a comparative example.
Figure 7:
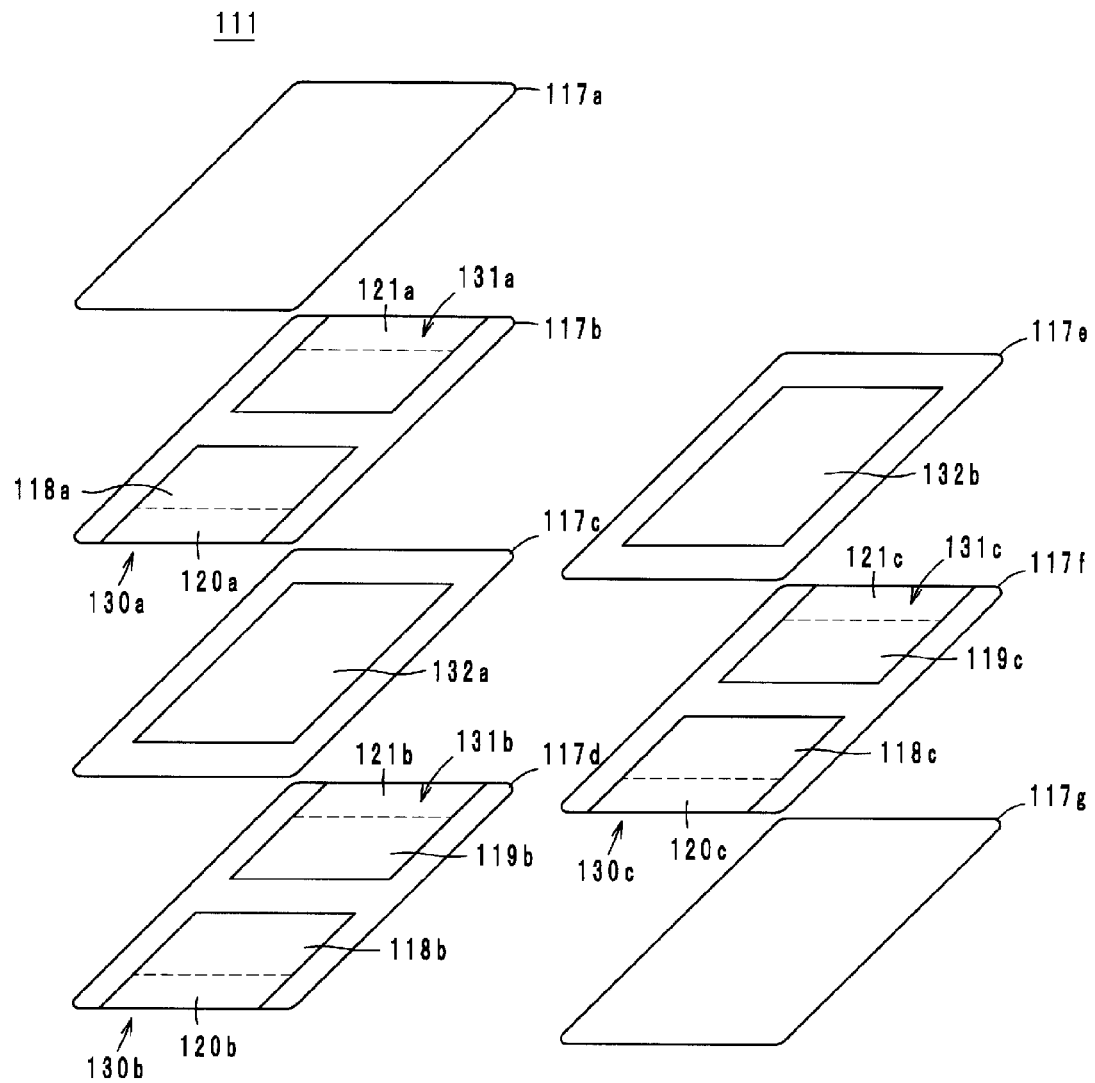
FIG. 7 is an exploded perspective view of a multilayer body of the electronic component according to the comparative example.

With the above-described electronic component 10, as will be described below, a significant reduction in ESL can be achieved. FIG. 6 is an external perspective view of an electronic component 110 according to a comparative example. FIG. 7 is an exploded perspective view of a multilayer body 111 of the electronic component 110 according to the comparative example. The electronic component 110 according to the comparative example is obtained by removing the led out conductors 22 to 25 and the external electrodes 13 to 16 from the electronic component 10. Accordingly, in the electronic component 110, structures the same as those in the electronic component 10 are denoted by reference symbols obtained by adding 100 to the reference symbols of the structures of the electronic component 10.

In the electronic component 110 according to the comparative example, a high-frequency signal is input to the inside of the electronic component 110 from the signal conductor via an external electrode 112a and is output to the ground electrode via an external electrode 112b. At this time, a high-frequency signal flows through the signal conductor, the external electrode 112a, a led out conductor 120, a capacitance conductor 118, an internal conductor 132, a capacitance conductor 119, a led out conductor 121, the external electrode 112b and the ground electrode in this order. That is, in the electronic component 110 according to the comparative example, a high-frequency signal passes along only a single path.

On the other hand, in the electronic component 10, a high-frequency signal is input to the inside of the electronic component 10 from the signal conductor 54 via the external electrode 12a and is output to the ground electrode 55 via the external electrode 12b. At this time, the high-frequency signal passes along a first path and a second path, which will be described below.

The first path is a path in which a high-frequency signal flows through the signal conductor 54, the external electrode 12a, the led out conductor 20, the capacitance conductor 18, internal conductor 32, the capacitance conductor 19, the led out conductor 21, the external electrode 12b and the ground electrode 55 in this order.

The second path is a path in which a high-frequency signal flows through the signal conductor 54, the external electrode 12a, the led out conductor 20, the capacitance conductor 18, the led out conductors 22 and 23, the external electrodes 13 and 14, the external electrodes 15 and 16, the led out conductors 24 and 25, the capacitance conductor 19, the led out conductor 21, the external electrode 12b and the ground electrode 55 in this order. Here, in the second path, the high-frequency signal passes from the external electrodes 13 and 14 to the external electrodes 15 and 16 by passing through the multilayer body 11 between the external electrodes 13 and 14 and the external electrodes 15 and 16.

As has been described above, in the substrate module 40, in which the electronic component 10 is mounted, the high-frequency signal passes along the first path and the second path, which are connected in parallel with each other. Here, the first path of the electronic component 10 is the same as the path of the electronic component 110. Therefore, the electronic component 10 has a structure obtained by adding the second path to the electronic component 110. A combined inductance value LT of an inductance value L1 of the first path and an inductance value L2 of the second path is expressed by Eq. (1) below.

$$LT = L1 \cdot L2/(L1+L2) \qquad (1)$$

The inductance value of the path in the electronic component 110 is the inductance value L1. Therefore, the combined inductance value LT of the first path and the second path of the electronic component 10 is smaller than the inductance value L1 of the path in the electronic component 110. That is, the electronic component 10 achieves a significant reduction in ESL compared to the electronic component 110.

In addition, in the electronic component 10, as a result of a reduction in ESL being achieved, the resonant frequency is increased and the insertion loss of the electronic component 10 in a high frequency band is reduced.

Since a high-frequency signal flows from the external electrodes 13 and 14 to the external electrodes 15 and 16, it is preferable that external electrodes held at potentials different to the potentials of the external electrodes 13 and 15 be not provided between the external electrode 13 and the external electrode 15 on the side surface S5. Similarly, on the side surface S6, it is preferable that external electrodes held at potentials different from those of the external electrodes 14 and not be provided between the external electrode 14 and the external electrode 16.

In more detail, in the electronic component 10, it is necessary that a high-frequency signal pass toward the positive side in the x-axis direction. However, if external electrodes held at potentials different from those of the external electrodes 13 and 14 are provided between the end surface S3 and the external electrodes 13 and 14 on the side surfaces S5 and S6 of the electronic component 10, a high-frequency signal will flow from the external electrodes 13 and 14 toward these external electrodes (that is, toward the negative side in the x-axis direction). That is, a high-frequency signal will pass through in the opposite direction to that in which a high-frequency signal should pass through. Consequently, loss will occurs while a high-frequency signal passes through.

In addition, since a high-frequency signal flows from the external electrodes 13 and 14 to the external electrodes 15 and 16, it is preferable that the gap between the external electrodes 13 and 14 and the gap between the external electrodes 15 and 16 be as small as possible and, for example, these gaps are preferably about 50 µm and about 200 µm or less.

Comparing the electronic component 10 and the electronic component 110, there is a tendency for the shift width of the secondary resonance point to be larger than the shift width of the primary resonance point. This is thought to be due to the effect of the second path in the electronic component 10. In the electronic component 10 and the electronic component 110, it is thought that a high-frequency signal having a frequency higher than the primary resonance point comes to flow so as to be concentrated in a portion close to the circuit substrate 51, a relatively small capacitance is generated close to the lower surface of the electronic component 10 or the electronic component 110 and a corresponding resonance point appears as a secondary resonance point. Here, it is presumed that, in the electronic component 10, since the ESL of the relatively small capacitance is particularly reduced due to the high-frequency signal flowing through the second path, the secondary resonance point is shifted by a large amount toward the high frequency side.

In addition, comparing the electronic component 10 and the electronic component 110, there is a tendency for the trough of the secondary resonance point to be shallow.

As has been described above, if the secondary resonance point is shifted away from the primary resonance point and the trough of the secondary resonance point is shallow, it is possible to prevent a device that operates at a frequency between the primary resonance point and the secondary resonance point from malfunctioning.

In addition, with the electronic component 10, the occurrence of short circuits when mounting the electronic component 10 on the circuit substrate 51 can be prevented and suppressed. In more detail, in the multilayer capacitor 500 described in Japanese Unexamined Patent Application Publication No. 2004-140183, since the external electrodes 512 and 514 are close to each other, there is a risk of the external electrode 512 and the external electrode 514 becoming connected to each other via solder when the multilayer capacitor 500 is being mounted on a circuit substrate. That is, with the multilayer capacitor 500, there is a risk of a short circuit occurring.

On the other hand, in the electronic component 10, the external electrodes 12a and 12b are not close to each other when compared to the external electrodes 512 and 514 of the multilayer capacitor 500 described in Japanese Unexamined Patent Application Publication No. 2004-140183. Instead, the external electrode 13 and the external electrode 15 are close to each other. Similarly, the external electrode 14 and the external electrode 16 are close to each other. However, the external electrodes 13 to 16 are not mounted with solder on the circuit substrate 51. Consequently, the possibility of connection occurring between the external electrode 13 and the external electrode 15 and between the external electrode 14 and the external electrode 16 due to solder is low. Therefore, with the electronic component 10, the occurrence of short circuits when mounting the electronic component 10 on the circuit substrate 51 can be prevented and suppressed.

With the electronic component 10, the occurrence of de-lamination can be prevented and suppressed. In more detail, in an electronic component, de-lamination is liable to occur at the corners of the multilayer body thereof. When led out electrodes and ceramic layers are stacked on top of one another at the corners, it is particularly likely that de-lamination will occur between the led out electrodes and the ceramic layers. Accordingly, in the electronic component 10, the led out conductors 20 and 21 are not led out to the corners of the multilayer body 11. Thus, with the electronic component 10, the occurrence of de-lamination is prevented and suppressed. In addition, in the electronic component 10, since the led out conductors 20 and 21 are not exposed at the corners of the multilayer body 11, the moisture resistance of the electronic component 10 is improved.

The inventors of the present application performed the following experiments in order to clarify the advantages exhibited by the electronic component 10. Specifically, samples of the electronic component 10 illustrated in FIG. 1 and FIG. 2 (hereafter, first sample, third sample, fifth sample and seventh sample) and samples of the electronic component 110 illustrated in FIG. 6 and FIG. 7 (second sample, fourth sample, sixth sample and eighth sample) were fabricated. Each of the samples was mounted on the circuit substrate illustrated in FIGS. 4A and 4B and the ESL of the first to eighth samples and the insertion loss (S21) between the input port P1 and the output port P2 of the first to eighth samples were measured using a network analyzer (Agilent 8722D). First, the characteristics of each of the samples will be described.

Dimensions: 1.60 mm (L)×0.85 mm (W)×1.70 mm (T)
Material of internal conductors and external electrodes: Cu
Relative dielectric constant ($\in$) of ceramic layers: 27
Element thickness (gap between internal conductors 30 and 31): 122 µm
External layer thickness (distance from internal conductors 30a and 31a to upper surface S1 of multilayer body 11 and distance from internal conductors 30c and 31c to lower surface S2 of multilayer body 11): 88 µm
Table 1 illustrates the characteristics of each of the samples.

TABLE 1

|  | External Electrodes 13 to 16 and Led Out Conductors 22 to 25 Present? | Gap Between Capacitance Conductors 18, 19, 118 and 119 and Internal Conductors 32 and 132 | Number of Internal Conductors 30 to 32 and 130 to 132 | Electrostatic Capacitance (pF) |
| --- | --- | --- | --- | --- |
| First Sample | Present | 77 | 7 | 3.01 |
| Second Sample | Not Present | 77 | 7 | 3.01 |
| Third Sample | Present | 55 | 9 | 5.13 |
| Fourth Sample | Not Present | 55 | 9 | 5.13 |
| Fifth Sample | Present | 44 | 11 | 7.61 |
| Sixth Sample | Not Present | 44 | 11 | 7.61 |
| Seventh Sample | Present | 33 | 15 | 13.8 |
| Eighth Sample | Not Present | 33 | 15 | 13.8 |

The first to eighth samples having the above characteristics had the following values of ESL. ESL was measured in a frequency band of about 0.5 to 20 GHz. Table 2 illustrates the values of ESL of the first to eighth samples.

TABLE 2

|  | ESL (pH) |
| --- | --- |
| First Sample | 425 |
| Second Sample | 489 |
| Third Sample | 433 |
| Fourth Sample | 480 |
| Fifth Sample | 437 |
| Sixth Sample | 489 |
| Seventh Sample | 405 |
| Eighth Sample | 459 |

Therefore, it is clear from these experiments that, with the electronic component 10, a decrease in ESL of approximately 10% from that of the electronic component 110 is achieved.

Figure 8:
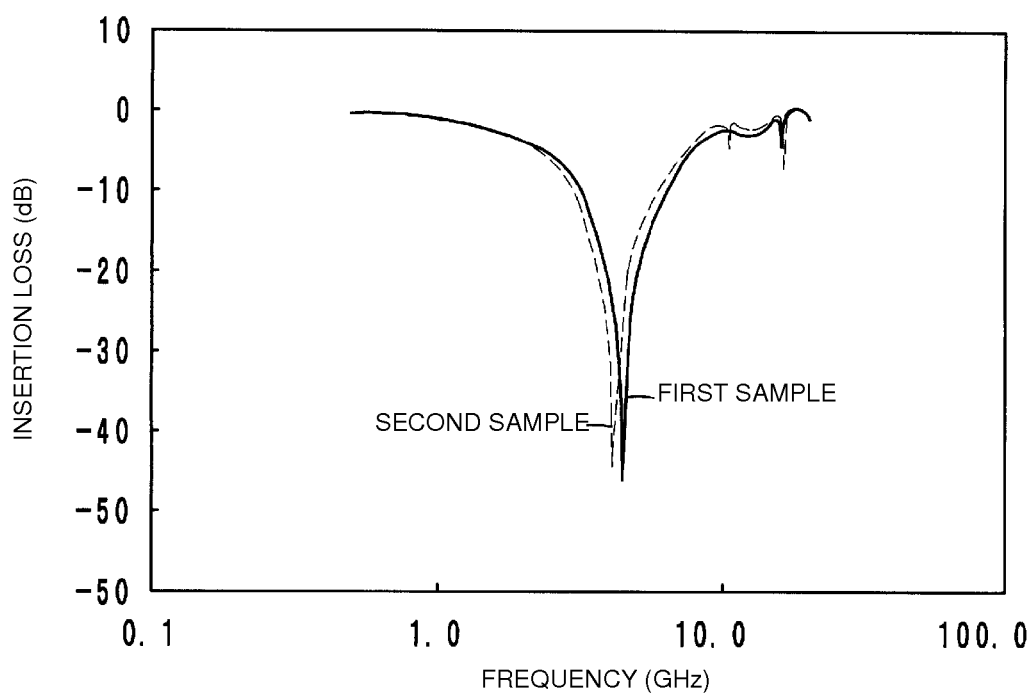
FIG. 8 is a graph illustrating the insertion loss (S21) of a first sample and a second sample.
Figure 9:
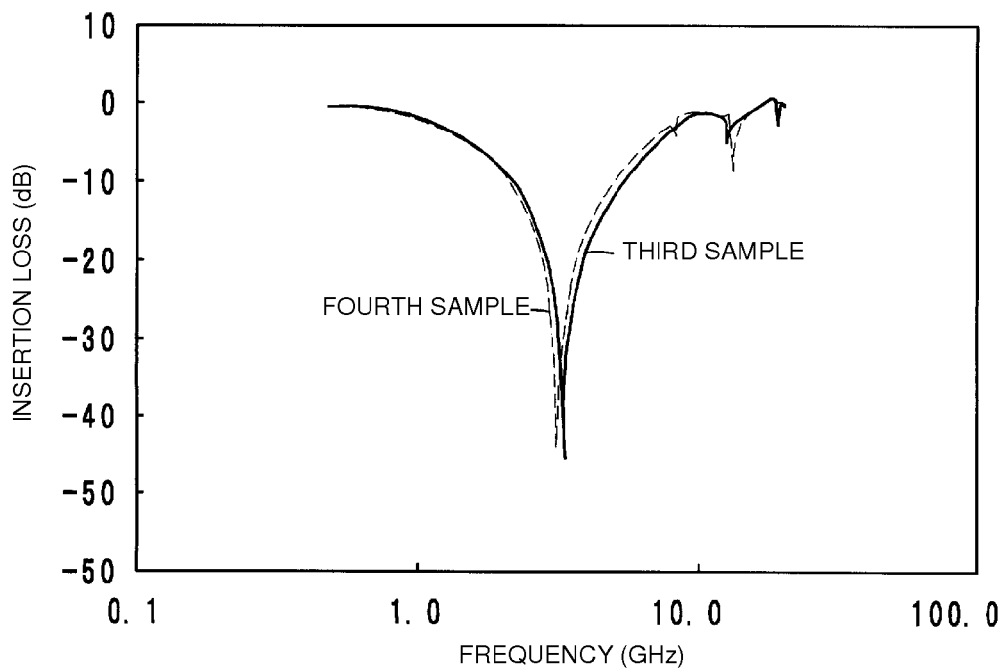
FIG. 9 is a graph illustrating the insertion loss (S21) of a third sample and a fourth sample.
Figure 10:
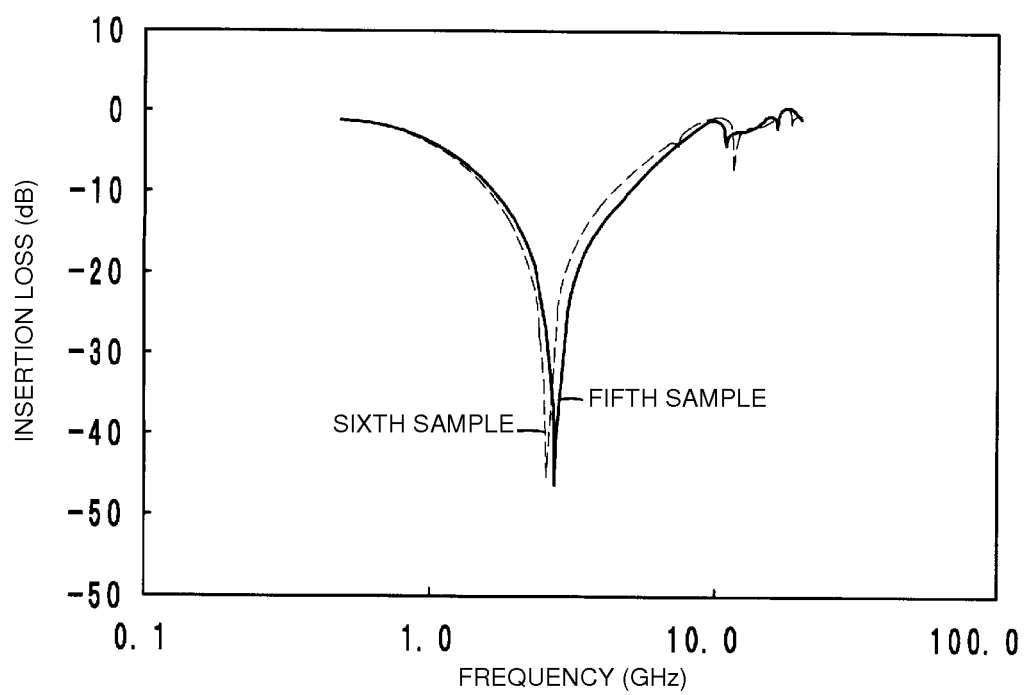
FIG. 10 is a graph illustrating the insertion loss (S21) of a fifth sample and a sixth sample.
Figure 11:
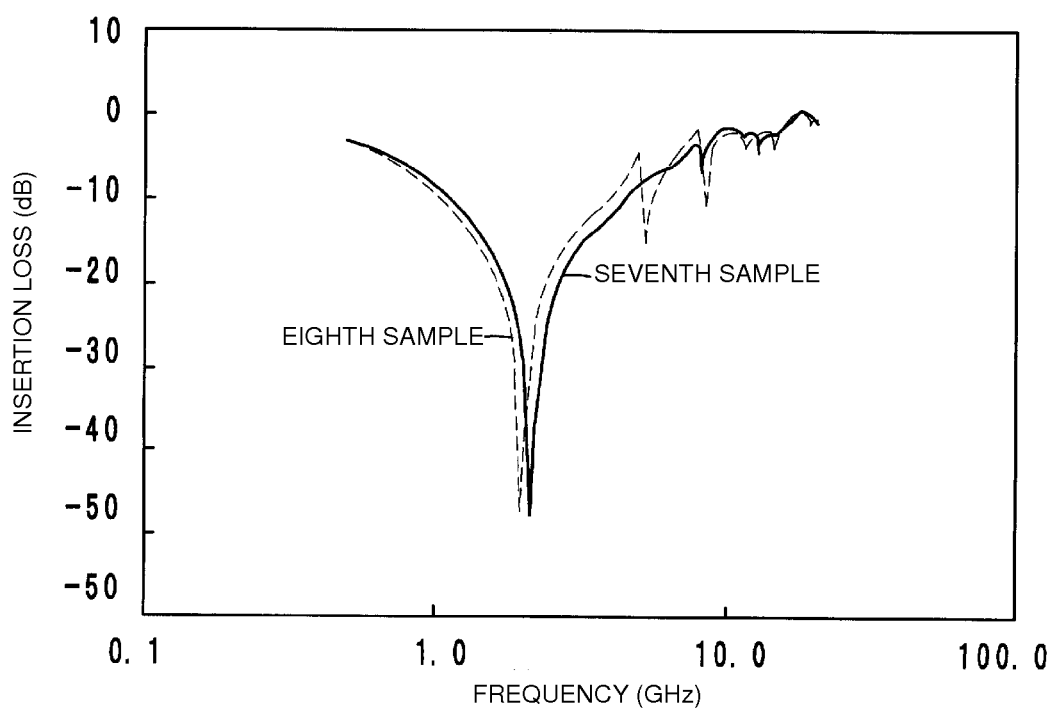
FIG. 11 is a graph illustrating the insertion loss (S21) of a seventh sample and an eighth sample.

FIG. 8 is a graph illustrating the insertion loss (S21) of the first sample and the second sample. FIG. 9 is a graph illustrating the insertion loss (S21) of the third sample and the fourth sample. FIG. 10 is a graph illustrating the insertion loss (S21) of the fifth sample and the sixth sample. FIG. 11 is a graph illustrating the insertion loss (S21) of the seventh sample and the eighth sample. The vertical axis represents insertion loss and the horizontal axis represents frequency.

According to FIGS. 8 to 11, it is clear that the primary resonance points f1 of the first sample, the third sample, the fifth sample and the seventh sample are respectively higher than the primary resonance points f1 of the second sample, the fourth sample, the sixth sample and the eighth sample. Table 3 illustrates the primary resonance points f1 of the first to eighth samples.

TABLE 3

|  | Primary Resonance Point (GHz) |
| --- | --- |
| First Sample | 4.45 |
| Second Sample | 4.15 |
| Third Sample | 3.38 |
| Fourth Sample | 3.21 |
| Fifth Sample | 2.76 |
| Sixth Sample | 2.61 |
| Seventh Sample | 2.13 |
| Eighth Sample | 2.00 |

As described above, according to the experimental results illustrated in FIGS. 8 to 11, it is clear that the high-frequency characteristics of the electronic component 10 are superior to the high-frequency characteristics of the electronic component 110. Specifically, the primary resonance point f1 of the electronic component 10 is approximately 5% higher than the primary resonance point f1 of the electronic component 110.

In addition, according to the experimental results illustrated in FIGS. 8 to 11, it is clear that the secondary resonance point f2 of the electronic component 10 is higher than the secondary resonance point f2 of the electronic component 110. For example, in the graph of FIG. 11, the secondary resonance point of the eighth sample is about 8 GHz, whereas the secondary resonance point of the seventh sample is about 10 GHz. In addition, the insertion loss at the secondary resonance point f2 of the electronic component 10 is smaller than the insertion loss at the secondary resonance point f2 of the electronic component 110. From the above, with the electronic component 10, insertion loss can be reduced in a high frequency band.

Second Preferred Embodiment

Figure 12:
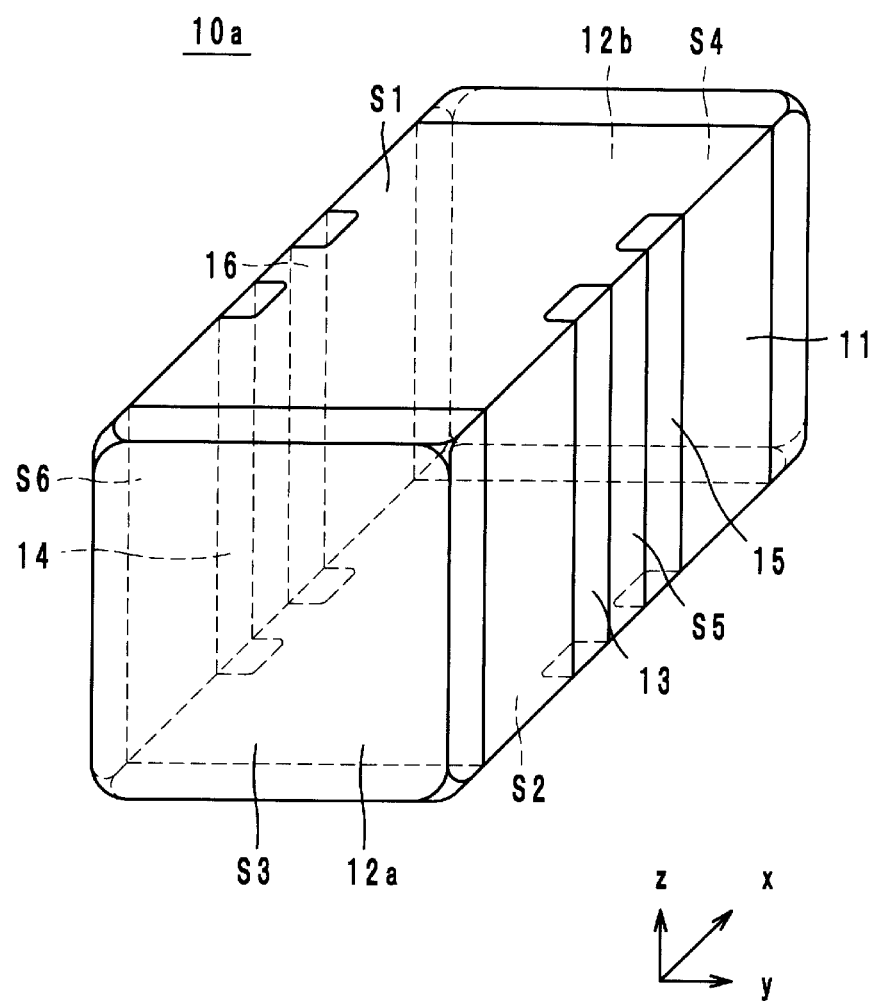
FIG. 12 is an exterior perspective view of an electronic component according to a second preferred embodiment of the present invention.

Hereafter, an electronic component and a substrate module according to a second preferred embodiment will be described with reference to the drawings. FIG. 12 is an external perspective view of an electronic component 10a according to the second preferred embodiment.

In the electronic component 10a, the external electrodes 13 and 15 are folded over from the side surface S5 onto the upper surface S1 and the lower surface S2. In addition, the external electrodes 14 and 16 are folded over from the side surface S6 onto the upper surface S1 and the lower surface S2. Other aspects of the configuration of the electronic component 10a are the same as those of the electronic component 10 and therefore description thereof will be omitted.

With the above-described electronic component 10a, similarly to as with the electronic component 10, a significant reduction in ESL can be achieved and the occurrence of short circuits when mounting the electronic component 10a on a circuit substrate can be prevented and suppressed.

Figure 13:
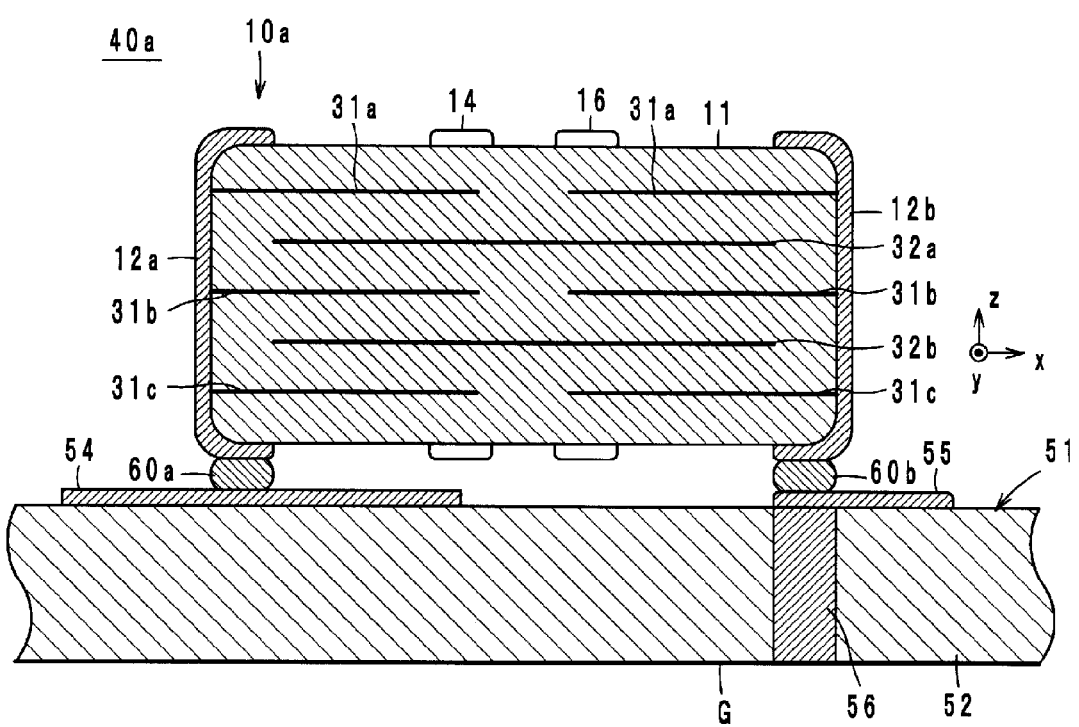
FIG. 13 is a sectional structural view of a substrate module.

Next, a substrate module 40a that includes the electronic component 10a will be described while referring to the drawings. FIG. 13 is a sectional structural view of the substrate module 40a.

The electronic component 10a is mounted on the circuit substrate 51. In more detail, the external electrode 12a is connected to the signal conductor 54 with the solder 60a. In addition, the external electrode 12b is connected to the ground electrode 55 with the solder 60b. Thus, similarly to the substrate module 40, the substrate module 40a comes to have the circuit configuration illustrated in FIG. 5.

First Modification

Figure 14:
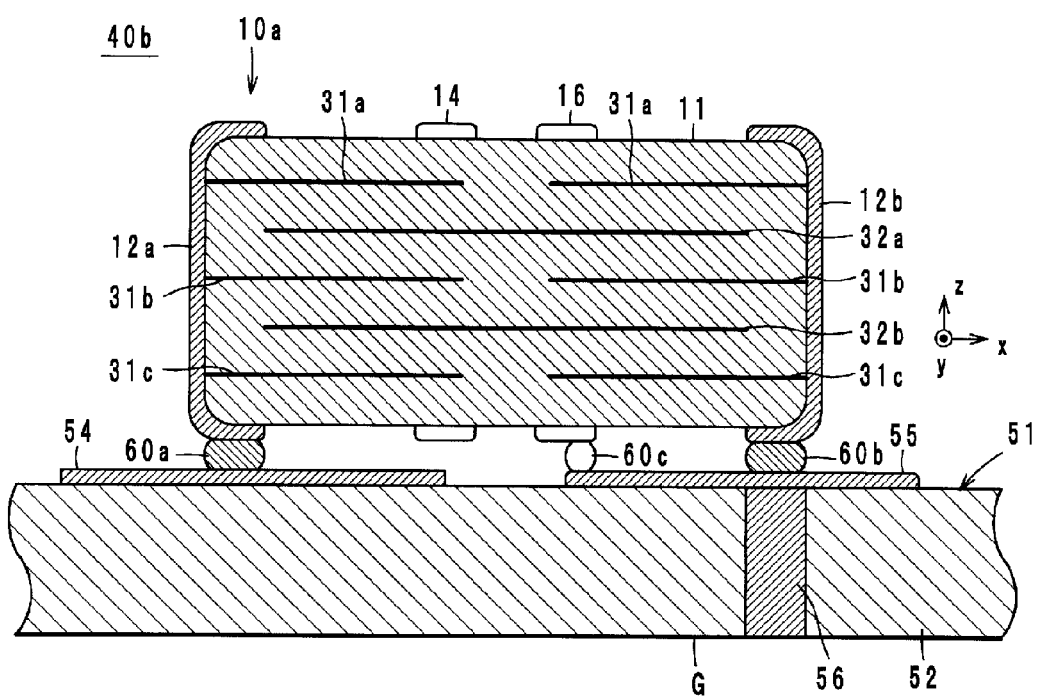
FIG. 14 is a sectional structural view of a substrate module.

Next, a substrate module according to a first modification will be described with reference to the drawings. FIG. 14 is a sectional structural view of a substrate module 40b.

The substrate module 40b differs from the substrate module 40a in that the external electrodes 15 and 16 are connected to the ground electrode 55 with solder 60c. Since there are no other differences, description of other aspects of the configuration of the substrate module 40b will be omitted.

In the substrate module 40a, a high-frequency signal passes along the first path and the second path. On the other hand, in the substrate module 40b, a high-frequency signal passes along a third path and a fourth path to be described below, as well as along the first path and the second path.

The third path is a path in which a high-frequency signal flows through the signal conductor 54, the external electrode 12a, the led out conductor 20, the capacitance conductor 18, the internal conductor 32, the capacitance conductor 19, the led out conductors 24 and 25, the external electrodes 15 and 16 and the ground electrode 55 in this order. The fourth path is a path in which a high-frequency signal flows through the signal conductor 54, the external electrode 12a, the led out conductor 20, the capacitance conductor 18, the led out conductors 22 and 23, the external electrodes 13 and 14, the external electrodes 15 and 16, and the ground electrode 55 in this order.

As described above, in the substrate module 40b, a high-frequency signal passes along the third path and the fourth path, as well as along the first path and the second path. As a result, with the substrate module 40b, a further decrease in ESL is achieved over the substrate module 40a and high-frequency characteristics are improved.

In addition, in the substrate module 40b, the external electrodes 15 and 16, which are close to the external electrodes 13 and 14, are connected to the ground electrode 55 with the solder 60c. Here, fixing of the electronic component 10 to the circuit substrate 51 is mainly performed by connecting the external electrode 12a and the signal conductor 54 to each other and connecting the external electrode 12b and the ground electrode 55 to each other. Consequently, it is sufficient that the external electrodes 15 and 16 be simply electrically connected to the ground electrode 55 and the external electrodes 15 and 16 need not be strongly fixed to the ground electrode 55. Therefore, the amount of solder 60c may be small. As a result, the probability of the external electrodes 13 and 14 and the external electrodes 15 and 16 becoming connected with each other via the solder 60c is small. In other words, with the substrate module 40b, the occurrence of short circuits when mounting the electronic device 10 on the circuit substrate 51 can be prevented and suppressed.

Second Modification

Figure 15:
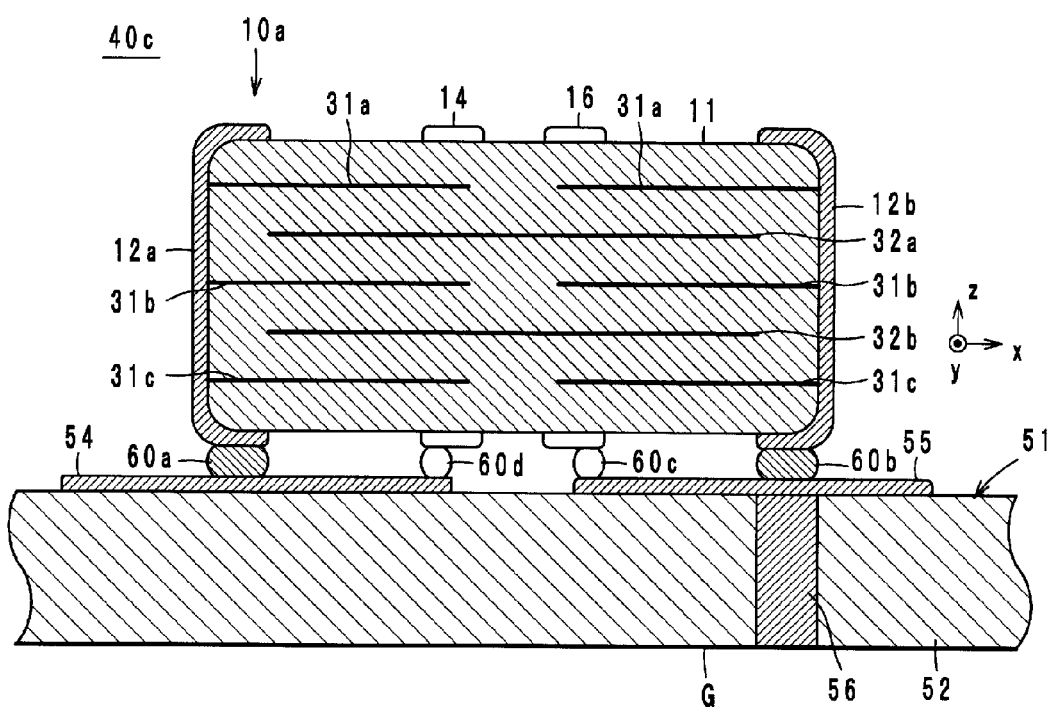
FIG. 15 is a sectional structural view of a substrate module.

Next, a substrate module according to a second modification will be described with reference to the drawings. FIG. 15 is a sectional structural view of a substrate module 40c.

The substrate module 40c differs from the substrate module 40b in that the external electrodes 13 and 14 are connected to the signal conductor 54 with solder 60d. Since there are no other differences, description of other aspects of the configuration of the substrate module 40c will be omitted.

In the substrate module 40b, a high-frequency signal passes along the first to fourth paths. On the other hand, in the substrate module 40c, a high-frequency signal passes along fifth to seventh paths to be described below, as well as along the first to fourth paths.

The fifth path is a path in which a high-frequency signal flows through the signal conductor 54, the external electrodes 13 and 14, the led out conductors 22 and 23, the capacitance conductor 18, the internal conductor 32, the capacitance conductor 19, the led out conductor 21, the external electrode 12b and the ground electrode 55 in this order. The sixth path is a path in which a high-frequency signal flows through the signal conductor 54, the external electrodes 13 and 14, the led out conductors 22 and 23, the capacitance conductor 18, the internal conductor 32, the capacitance conductor 19, the led out conductors 24 and 25, the external electrodes 15 and 16 and the ground electrode 55 in this order. The seventh path is path in which a high-frequency signal flows through the signal conductor 54, the external electrodes 13 and 14, the external electrodes 15 and 16, and the ground electrode 55 in this order.

As described above, in the substrate module 40c, a high-frequency signal passes along the fifth to seventh paths, as well as along the first to fourth paths. As a result, with the substrate module 40c, a further decrease in ESL is achieved over the substrate module 40b and high-frequency characteristics are improved.

Furthermore, in the substrate module 40c, the external electrodes 13 and 14 are connected to the signal conductor 54 with the solder 60d and the external electrodes 15 and 16 are connected to the ground electrode 55 with the solder 60c. Here, fixing of the electronic component 10 to the circuit substrate 51 is mainly performed by connecting the external electrode 12a and the signal conductor 54 to each other and connecting the external electrode 12b and the ground electrode 55 to each other. Consequently, it is sufficient that the external electrodes 13 and 14 be simply electrically connected to the signal conductor 54 and the external electrodes 13 and 14 need not be strongly fixed to the signal conductor 54. Similarly, it is sufficient that the external electrodes 15 and 16 be electrically connected to the ground electrode 55 and the external electrodes 15 and 16 need not be strongly fixed to the ground electrode 55. Therefore, the amounts of solder 60c and 60d may be small. As a result, the probability of the external electrodes 13 and 14 and the external electrodes 15 and 16 becoming connected with each other via the solder 60c and 60d is small. In other words, with the substrate module 40c, the occurrence of short circuits when mounting the electronic device 10 on the circuit substrate 51 can be prevented and suppressed.

Third Preferred Embodiment

Figure 16:
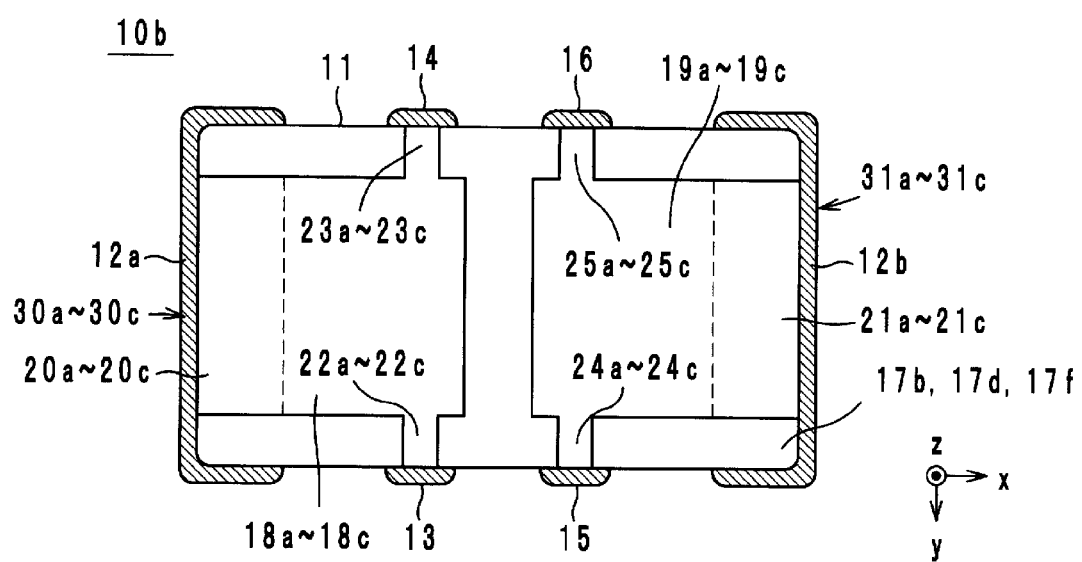
FIG. 16 is plan view of the inside of an electronic component according to a third preferred embodiment of the present invention.

Hereafter, the configuration of an electronic component 10b according to a third preferred embodiment will be described with reference to the drawings. FIG. 16 is a plan view of the inside of the electronic component 10b according to the third preferred embodiment. Since an external perspective view of the electronic component 10b is the same as the external perspective view of the electronic component 10, FIG. 1 will be used.

The electronic component 10 and the electronic component 10b differ in terms of the shapes of the internal conductors 30 and 31. In more detail, the internal conductors 30 and 31 (capacitance conductors 18 and 19) of the electronic component 10b are closer to each other than the internal conductors 30 and 31 (capacitance conductors 18 and 19) of the electronic component 10 are. Thus, in the electronic component 10b, the areas of the portions in which the capacitance conductors 18 and 19 and the internal conductor 32 oppose each other are larger than in the electronic component 10. As a result, the capacitance value of the electronic component 10b can be made larger.

Fourth Preferred Embodiment

Figure 17:
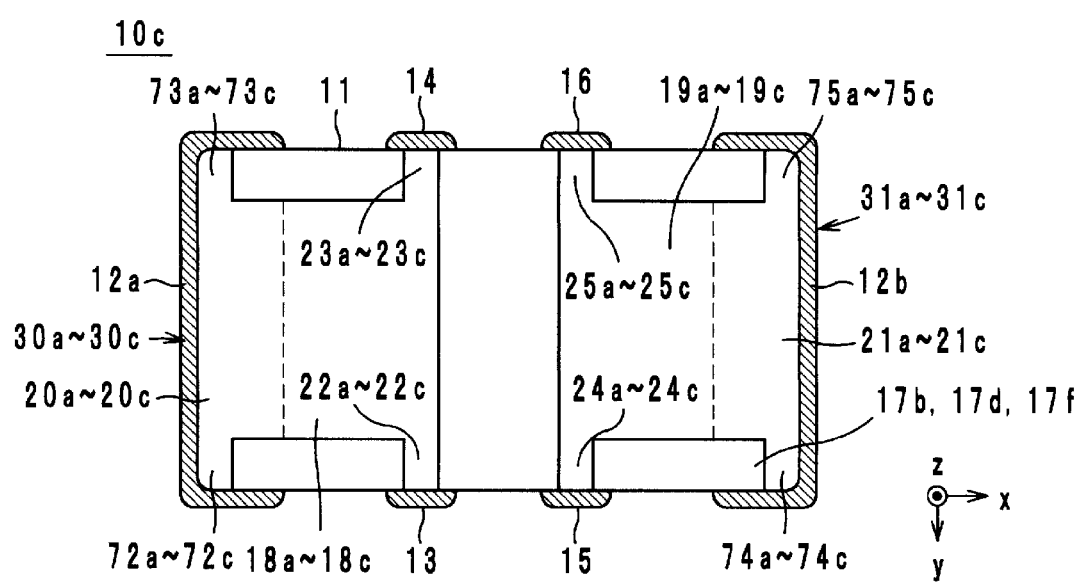
FIG. 17 is plan view of the inside of an electronic component according to a fourth preferred embodiment of the present invention.

Hereafter, the configuration of an electronic component 10c according to a fourth preferred embodiment will be described with reference to the drawings. FIG. 17 is a plan view of the inside of the electronic component 10c according to the fourth preferred embodiment. Since an external perspective view of the electronic component 10c is the same as the external perspective view of the electronic component 10, FIG. 1 will be used.

The electronic component 10 and the electronic component 10c differ in terms of the existence of led out conductors 72 (72a to 72c), 73 (73a to 73c), 74 (74a to 74c) and 75 (75a to 75c).

The led out conductor 72 is connected to a connection conductor 20 and is exposed at the side surface S5 as a result of being led out to the side surface S5 of the multilayer body 11. Thus, the led out conductor 72 is in contact with the short edge of the ceramic layer 17 on the negative side in the x-axis direction. Thus, the led out conductor 72 is connected to the external electrode 12a at the long edge of the ceramic layer 17 on the positive side in the y-axis direction and at the short edge of the ceramic layer 17 on the negative side in the x-axis direction.

The led out conductor 73 is connected to the connection conductor 20 and is exposed at the side surface S6 as a result of being led out to the side surface S6 of the multilayer body 11. Thus, the led out conductor 73 is in contact with the short edge of the ceramic layer 17 on the negative side in the x-axis direction. Thus, the led out conductor 73 is connected to the external electrode 12a at the long edge of the ceramic layer 17 on the negative side in the y-axis direction and at the short edge of the ceramic layer 17 on the negative side in the x-axis direction.

The led out conductor 74 is connected to a connection conductor 21 and is exposed at the side surface S5 as a result of being led out to the side surface S5 of the multilayer body 11. The led out conductor 74 is in contact with the short edge of the ceramic layer 17 on the positive side in the x-axis direction. Thus, the led out conductor 74 is connected to the external electrode 12b at the long edge of the ceramic layer 17 on the positive side in the y-axis direction and at the short edge of the ceramic layer 17 on the positive side in the x-axis direction.

The led out conductor 75 is connected to the connection conductor 21 and is exposed at the side surface S6 as a result of being led out to the side surface S6 of the multilayer body 11. The led out conductor 75 is in contact with the short edge of the ceramic layer 17 on the positive side in the x-axis direction. Thus, the led out conductor 75 is connected to the external electrode 12b at the long edge of the ceramic layer 17 on the negative side in the y-axis direction and at the short edge of the ceramic layer 17 on the positive side in the x-axis direction.

In the electronic component 10c, since the led out conductors 72 to 75 are provided, the number of current paths inside the electronic component 10c is greater than the number of current paths inside the electronic component 10. As a result, the electronic component 10c can more effectively achieve a significant reduction in ESL.

Fifth Preferred Embodiment

Figure 18:
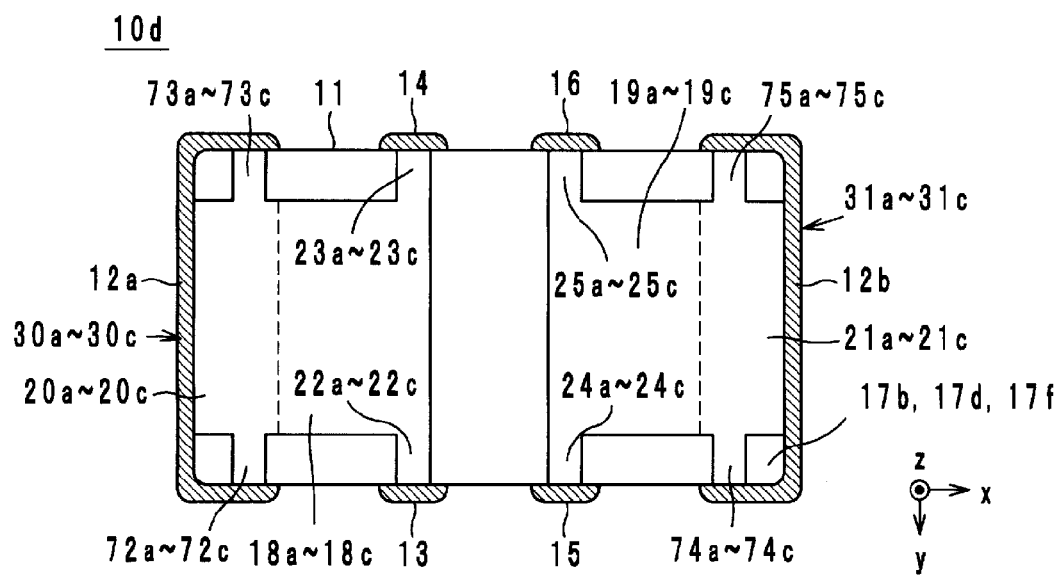
FIG. 18 is plan view of the inside of an electronic component according to a fifth preferred embodiment of the present invention.

Hereafter, the configuration of an electronic component 10d according to a fifth preferred embodiment will be described with reference to the drawings. FIG. 18 is a plan view of the inside of the electronic component 10d according to the fifth preferred embodiment. Since an external perspective view of the electronic component 10d is the same as the external perspective view of the electronic component 10, FIG. 1 will be used.

The electronic component 10c and the electronic component 10d differ in terms of the positions of the led out conductors 72 (72a to 72c), 73 (73a to 73c), 74 (74a to 74c) and 75 (75a to 75c). In more detail, in the electronic component 10d, the led out conductors 72 to 75 are not in contact with the short edges of the ceramic layer 17 on the positive side and the negative side in the x-axis direction. That is, the led out conductors 72 to 75 are not provided at the corners of the ceramic layers 17.

Since the led out conductors 72 to 75 are not provided at the corners of the multilayer body 11, the occurrence of delamination in the above-described electronic component 10d can be prevented and suppressed.

Sixth Preferred Embodiment

Figure 19:
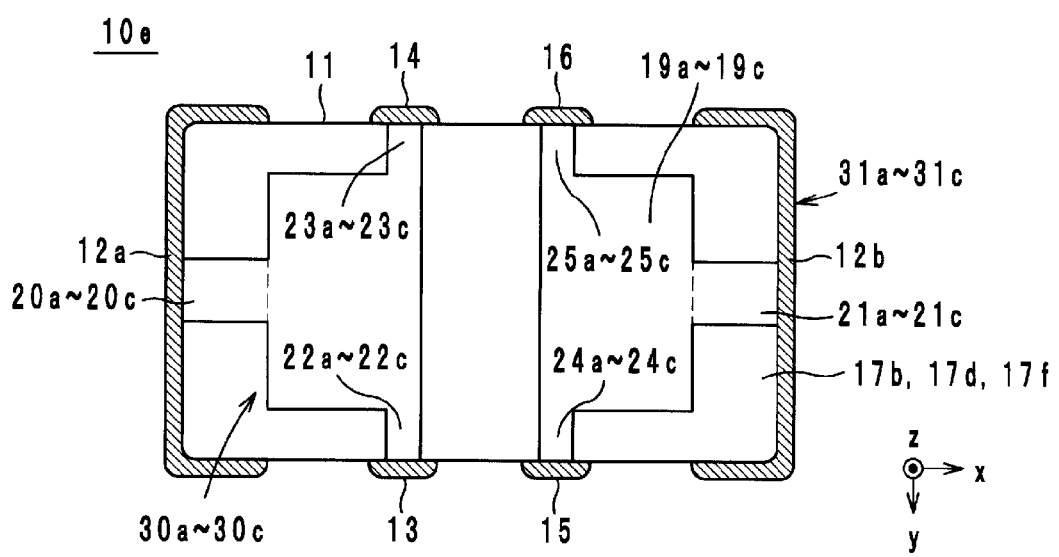
FIG. 19 is plan view of the inside of an electronic component according to a sixth preferred embodiment of the present invention.

Hereafter, the configuration of an electronic component 10e according to a sixth preferred embodiment will be described with reference to the drawings. FIG. 19 is a plan view of the inside of the electronic component 10e according to the sixth preferred embodiment. Since an external perspective view of the electronic component 10e is the same as the external perspective view of the electronic component 10, FIG. 1 will be used.

The electronic component 10 and the electronic component 10e differ from each other in terms of the shapes of the led out conductors 20 and 21. In more detail, the width of the led out conductors 20 and 21 of the electronic component 10e in the y-axis direction is smaller than the width of the led out conductors 20 and 21 of the electronic component 10 in the y-axis direction.

With the electronic component 10e, since the width of the led out conductors 20 and 21 is smaller, the areas of the portions at which the internal conductors 30 and 31 are exposed from the multilayer body 11 are smaller. As a result, in the electronic component 10e, it is more difficult for moisture to penetrate into the multilayer body 11.

Seventh Preferred Embodiment

Figure 20:
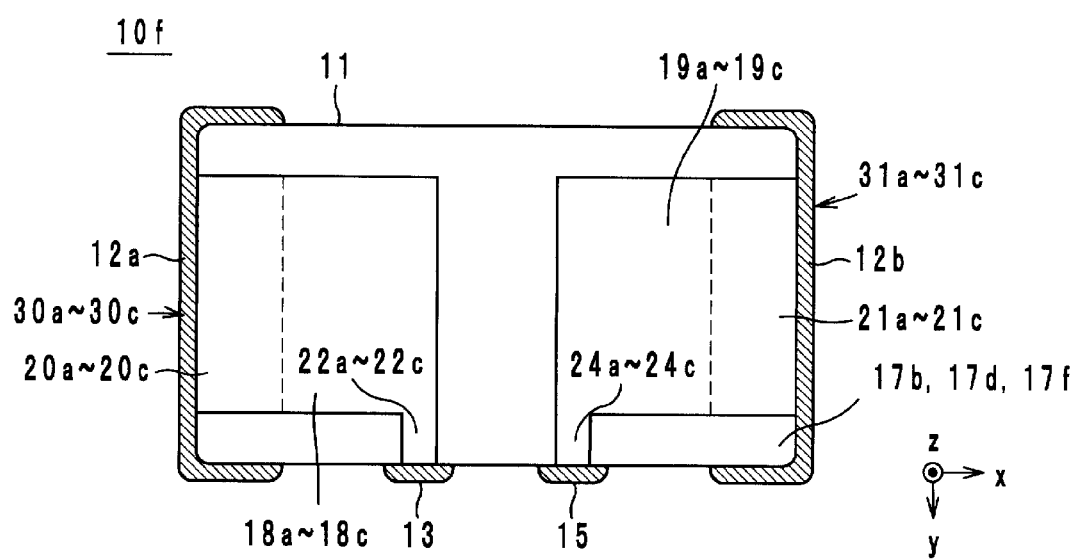
FIG. 20 is plan view of the inside of an electronic component according to a seventh preferred embodiment of the present invention.

Hereafter, the configuration of an electronic component 10f according to a seventh preferred embodiment will be described with reference to the drawings. FIG. 20 is a plan view of the inside of the electronic component 10f according to the seventh preferred embodiment.

The electronic component 10f, as illustrated in FIG. 20, differs from the electronic component 10 in that the led out conductors 23 and 25 are not provided. In this case, the electronic component 10f is mounted such that the side surface S5 faces the circuit substrate 51.

Eighth Preferred Embodiment

Figure 21:
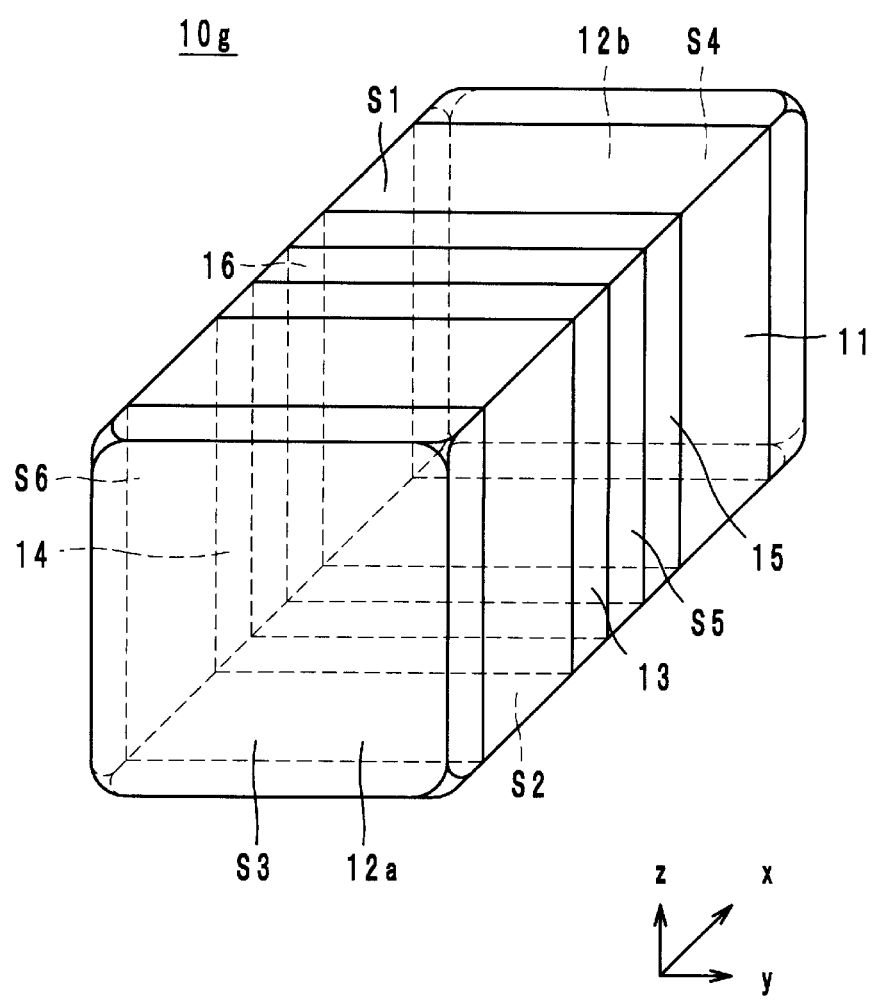
FIG. 21 is an external perspective view of an electronic component according to an eighth preferred embodiment of the present invention.
Figure 22:
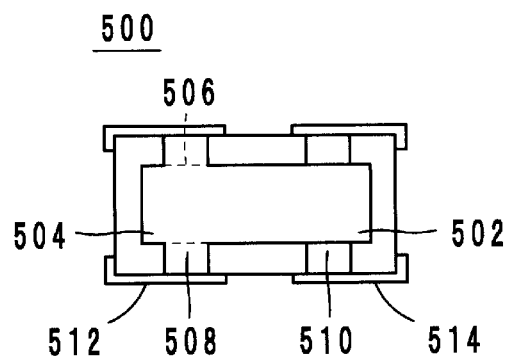
FIG. 22 is a front view of a multilayer capacitor described in Japanese Unexamined Patent Application Publication No. 2004-140183.

Hereafter, an electronic component 10g according to an eighth preferred embodiment will be described with reference to the drawings. FIG. 21 is an external perspective view of an electronic component 10g according to the eighth preferred embodiment.

As illustrated in FIG. 21, the external electrode 13 and the external electrode 14 may be connected to each other through external electrodes provided on the upper surface S1 and the lower surface S2. Similarly, the external electrode 15 and the external electrode 16 may be connected to each other through external electrodes provided on the upper surface S1 and the lower surface S2. The internal structure of the electronic component 10g may be any of the internal structures of the electronic components 10 and 10a to 10f.

Other Preferred Embodiments

The electronic components 10 and 10a to 10g and the substrate modules 40 and 40a to 40c according to the present invention are not limited to those described in the above-described preferred embodiments and can be modified within the scope of the gist of the present invention.

In addition, a resin material such as an epoxy resin or a polypropylene resin may be used instead of the ceramic layers 17.

As has been described above, various preferred embodiments of the present invention are of use in electronic components and substrate modules and are particularly excellent in that a reduction in ESL can be achieved and in that the occurrence of short circuits when mounting an electronic component onto a circuit substrate can be prevented and suppressed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a substantially rectangular-parallelepiped-shaped multilayer body including a plurality of dielectric layers stacked on top of one another;
   a first capacitance conductor that is provided on one of the dielectric layers;
   a first led out conductor that is connected to the first capacitance conductor and is led out to a first end surface of the multilayer body;
   a third led out conductor that is connected to the first capacitance conductor and is led out to a first side surface of the multilayer body;
   a second capacitance conductor that is provided on one of the dielectric layers;
   a second led out conductor that is connected to the second capacitance conductor and is led out to a second end surface of the multilayer body;
   a fourth led out conductor that is connected to the second capacitance conductor and is led out to the first side surface;
   a third capacitance conductor that is provided on one of the dielectric layers and that opposes the first capacitance conductor and the second capacitance conductor via the dielectric layer therebetween;

a first external electrode and a second external electrode that are arranged to extend over the first end surface and the second end surface respectively and onto a bottom surface of the multilayer body and that are respectively connected to the first led out conductor and the second led out conductor;

a third external electrode that is provided on the first side surface and is connected to the third led out conductor; and a fourth external electrode that is provided on the first side surface and is connected to the fourth led out conductor.

2. The electronic component according to claim 1, wherein, on the first side surface, an external electrode that is held at a potential different from that of the third external electrode is not provided between the first end surface and the third external electrode, and, on the first side surface, an external electrode that is held at a potential different from that of the fourth external electrode is not provided between the second end surface and the fourth external electrode.

3. The electronic component according to claim 1, wherein, on the first side surface, an external electrode that is held at a potential different from that of the third external electrode and that of the fourth external electrode is not provided between the third external electrode and the fourth external electrode.

4. The electronic component according to claim 1, further comprising:

a fifth led out conductor that is connected to the first capacitance conductor and is led out to a second side surface of the multilayer body;

a sixth led out conductor that is connected to the second capacitance conductor and is led out to the second side surface of the multilayer body;

a fifth external electrode that is provided on the second side surface and is connected to the fifth led out conductor; and a sixth external electrode that is provided on the second side surface and is connected to the sixth led out conductor; wherein on the second side surface, an external electrode that is held at a potential different from that of the fifth external electrode is not provided between the first end surface and the fifth external electrode; and on the second side surface, an external electrode that is held at a potential different from that of the sixth external electrode is not provided between the second end surface and the sixth external electrode.

5. The electronic component according to claim 1, wherein the first capacitance conductor and the second capacitance conductor are provided on the same dielectric layer.

6. A substrate module comprising:

a circuit substrate that includes a first land and a second land; and the electronic component according to claim 1, which is mounted on the circuit substrate; wherein the first external electrode is connected to the first land; and the second external electrode is connected to the second land.

7. The substrate module according to claim 6, wherein the fourth external electrode is connected to the second land.

8. The substrate module according to claim 7, wherein the third external electrode is connected to the first land.

* * * * *